US009390971B2

(12) United States Patent
Gordon et al.

(10) Patent No.: US 9,390,971 B2
(45) Date of Patent: Jul. 12, 2016

(54) SELF-ALIGNED BARRIER AND CAPPING LAYERS FOR INTERCONNECTS

(71) Applicant: President and Fellows of Harvard College, Cambridge, MA (US)

(72) Inventors: Roy Gerald Gordon, Cambridge, MA (US); Harish B. Bhandari, Brookline, MA (US); Yeung Au, Belmont, MA (US); Youbo Lin, Medford, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 14/793,872

(22) Filed: Jul. 8, 2015

(65) Prior Publication Data

US 2015/0325474 A1    Nov. 12, 2015

Related U.S. Application Data

(62) Division of application No. 13/962,856, filed on Aug. 8, 2013, now Pat. No. 9,112,005, which is a division of application No. 12/908,323, filed on Oct. 20, 2010, now Pat. No. 8,569,165.

(60) Provisional application No. 61/385,868, filed on Sep. 23, 2010, provisional application No. 61/254,601, filed on Oct. 23, 2009.

(51) Int. Cl.
| | |
|---|---|
| H01L 21/768 | (2006.01) |
| C23C 16/06 | (2006.01) |
| H01L 21/285 | (2006.01) |
| H01L 21/288 | (2006.01) |
| C23C 16/18 | (2006.01) |
| C23C 16/34 | (2006.01) |
| C23C 16/40 | (2006.01) |
| H01L 23/532 | (2006.01) |

(52) U.S. Cl.
CPC .......... *H01L 21/76871* (2013.01); *C23C 16/18* (2013.01); *C23C 16/34* (2013.01); *C23C 16/401* (2013.01); *H01L 21/288* (2013.01); *H01L 21/2885* (2013.01); *H01L 21/28506* (2013.01); *H01L 21/28556* (2013.01); *H01L 21/28562* (2013.01); *H01L 21/76814* (2013.01); *H01L 21/76826* (2013.01); *H01L 21/76829* (2013.01); *H01L 21/76831* (2013.01); *H01L 21/76832* (2013.01); *H01L 21/76834* (2013.01); *H01L 21/76835* (2013.01); *H01L 21/76843* (2013.01); *H01L 21/76849* (2013.01); *H01L 21/76862* (2013.01); *H01L 21/76867* (2013.01); *H01L 21/76873* (2013.01); *H01L 21/76874* (2013.01); *H01L 21/76876* (2013.01); *H01L 23/53238* (2013.01); *H01L 2924/0002* (2013.01)

(58) Field of Classification Search
CPC ............ H01L 21/768; H01L 21/76873; H01L 21/76874; H01L 21/76876; C23C 16/06; C23C 16/34
See application file for complete search history.

(56) References Cited

U.S. PATENT DOCUMENTS

| | | | | |
|---|---|---|---|---|
| 2005/0064708 A1* | 3/2005 | May | ................. | H01L 21/76844 438/687 |
| 2007/0216032 A1* | 9/2007 | Tee | ..................... | H01L 23/5329 257/774 |
| 2008/0254232 A1* | 10/2008 | Gordon | ................. | C07C 211/65 427/585 |
| 2011/0026232 A1* | 2/2011 | Lin | .................... | H01L 21/76898 361/760 |
| 2011/0254164 A1* | 10/2011 | Gordon | .................. | C23C 16/16 257/751 |
| 2013/0187273 A1* | 7/2013 | Zhang | ............... | H01L 23/53238 257/751 |
| 2013/0292806 A1* | 11/2013 | Ma | .......................... | H01L 29/06 257/632 |

OTHER PUBLICATIONS

Au, Yeung, et al., "Filling Narrow Trenches by Iodine-Catalyzed CVD of Copper and Manganese on Manganese Nitride Barrier/Adhesion Layers". Journal of the Electrochemical Society, 158 (5) D248-253 (2011).*
Li, Zhengwen, et al., "Atomic Layer Deposition of Ultrathin Copper Metal Films from a Liquid Copper(I) Amidinate Precursor". Journal of the Electrochemical Society, 153 (11) C787-C794 (2006).*

* cited by examiner

*Primary Examiner* — Bret Chen
(74) *Attorney, Agent, or Firm* — Wilmer Cutler Pickering Hale and Dorr LLP

(57) ABSTRACT

An interconnect structure for integrated circuits for copper wires in integrated circuits and methods for making the same are provided. Mn, Cr, or V containing layer forms a barrier against copper diffusing out of the wires, thereby protecting the insulator from premature breakdown, and protecting transistors from degradation by copper. The Mn, Cr, or V containing layer also promotes strong adhesion between copper and insulators, thus preserving the mechanical integrity of the devices during manufacture and use, as well as protecting against failure by electromigration of the copper during use of the devices and protecting the copper from corrosion by oxygen or water from its surroundings. In forming such integrated circuits, certain embodiments of the invention provide methods to selectively deposit Mn, Cr, V, or Co on the copper surfaces while reducing or even preventing deposition of Mn, Cr, V, or Co on insulator surfaces. Catalytic deposition of copper using a Mn, Cr, or V containing precursor and an iodine or bromine containing precursor is also provided.

6 Claims, 31 Drawing Sheets

SELF-ALIGNED BARRIER AND CAPPING LAYERS FOR INTERCONNECTS

RELATED APPLICATIONS

This patent disclosure is a divisional application of U.S. patent application Ser. No. 13/962,856, filed Aug. 8, 2013, which is a divisional application of U.S. patent application Ser. No. 12/908,323, filed Oct. 20, 2010, now U.S. Pat. No. 8,569,165, which claims the benefit of the earlier filing date of U.S. Patent Application No. 61/254,601, filed on Oct. 23, 2009, and U.S. Patent Application No. 61/385,868, filed on Sep. 23, 2010, the contents of which are hereby incorporated by reference herein in their entireties.

This patent disclosure is related to U.S. patent application Ser. No. 12/408,473, filed on Mar. 20, 2009, which claims the benefit of the filing date of U.S. Patent Application No. 61/038,657, filed on Mar. 21, 2008, U.S. Patent Application No. 61/043,236, filed on Apr. 8, 2008, and U.S. Patent Application No. 61/074,467, filed on Jun. 20, 2008, the contents of which are hereby incorporated by reference herein in their entireties.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

Copper (Cu) is replacing aluminum as the material of choice for wiring of microelectronic devices, such as microprocessors and memories. However, the presence of copper in semiconductors such as silicon causes defects that can prevent the proper functioning of transistors formed in the semiconductor. Copper also increases the leakage of current through insulators, such as silicon dioxide, placed between the copper wires. Therefore use of copper wiring demands that efficient diffusion barriers surround the copper wires, to keep the copper confined to its proper locations.

While many efforts at providing diffusion barrier layers around copper have been attempted, they all suffer from some form of disadvantage. Disadvantages include unacceptably high dielectric constant (such as SiC or $Si_3N_4$) leading to increased capacitances lowering the speed with which signals can be transmitted through the copper wiring, difficulties in processing (such as electroless deposition of CoWP or CoWB) leading to electrical shorts over insulators between copper wires, increased resistance of copper through incorporation of other materials (such as CoWP, CoWB, or Mn) used to form the barrier layers, increased resistance of copper through restriction of the copper grain growth during anneal caused by presence of impurities (such as Mn), poor adhesion of the barrier layer (such as $MnO_x$) to copper, and the like.

Other efforts have focused on growth of the copper layer, such as growth of copper in narrow trenches and holes (also called vias) on top of barrier layers. To this effect, iodine has been proposed as a suitable catalyst in growing copper using a CVD technique. However, because iodine does not readily adhere to the barrier layers (such as TaN and TiN), a thin copper seeding layer or activation of the barrier layer with plasma pretreatment is needed within the trenches and holes, which has been extremely difficult to perform.

SUMMARY

This technology relates to copper interconnections used in microelectronics, and more particularly relates to materials and techniques to secure robust adhesion between the copper and the surrounding materials, providing barriers to prevent diffusion of copper out of the wiring, keeping oxygen and water from diffusing into the copper, and keeping the copper wires from being damaged by the electric current that they carry.

A process is described for forming a self-aligned diffusion barrier in microelectronic devices without the disadvantage of having a metallic impurity present in the Cu during or after the anneal. In one embodiment a metal such as Mn, Co, Cr or V is reacted with the surfaces of the insulator prior to deposition of a Cu-containing seed layer. In certain embodiments, the Mn, Co, Cr or V is delivered to the surfaces by a conformal chemical vapor deposition (CVD) process that does not involve the use of any oxygen-containing co-reactant along with the precursor for Mn, Co, Cr or V.

In certain embodiments, the CVD process may further comprise the use of a nitrogen-containing co-reactant, such as ammonia, thereby incorporating an electrically conductive metal nitride on or near the surfaces exposed to the vapors. The presence of metal nitride, such as manganese nitride, has been found to increase the adhesion to subsequently-deposited copper layers.

According to certain embodiments of the invention, this process does not increase via resistance by formation of barriers at the bottoms of the vias. Following the metal and/or metal-nitride-producing reaction, a Cu seed layer is deposited, preferably by CVD. The seed layer can also be deposited as a copper compound, such as copper oxide ($Cu_2O$), copper nitride ($Cu_3N$) or copper oxynitride ($CuO_zN_w$), which is later reduced to Cu.

In another aspect of the invention, Mn, Co, Cr or V is deposited on the planar surface of a partially completed interconnect just after a CMP step (i.e., a planarized structure). On the top of the insulating portions of the surface, the Mn, Co, Cr or V reacts with silicon and oxygen contained in the insulator to form an insulating metal silicate layer, e.g., a $MnSi_xO_y$ layer where the metal is Mn. In the region where the metal Mn is deposited on the tops of the Cu lines (the tops of the trenches filled with Cu), the Mn dissolves into the top layers of the Cu to form a Cu—Mn alloy. Then a blanket deposition of the insulator for the next higher level of insulator is formed over both the Cu—Mn and $MnSi_xO_y$ regions. During the deposition and/or during later anneals, the Mn in the Cu—Mn surface layer diffuses upward to react with the insulator to form a $MnSi_xN_y$ diffusion barrier between the Cu and the insulator, in the embodiment in which the initially-deposited part of this insulator is $Si_3N_4$. The presence of this $MnSi_xN_y$ layer also increases the adhesion between the Cu and the insulator above it.

Strongly adherent diffusion barrier and adhesion layers that surround the Cu on all of its surfaces can be obtained. The $MnSi_xO_y$ and $MnSi_xN_y$ layers provide highly conductive, strongly adherent and durable copper layers for, e.g., the production of electronic elements, circuits, devices, and systems.

In another aspect of the invention, Mn, Co, Cr or V is deposited selectively only on the metallic areas of the planar surface of a partially completed interconnect just after a CMP step (i.e., a planarized structure). At the same time little or no Mn, Co, Cr or V is deposited on nearby surfaces of insulators. The process increases the adhesion of copper to subsequently-deposited insulators while maintaining very low electrical leakage across insulators between neighboring copper conductors. This process increases the lifetime of copper interconnects before they fail due to electromigration.

In certain embodiments, the present application describes a process for forming an integrated circuit interconnect structure. The process comprises: providing a partially-completed interconnect structure that includes an electrically insulating region and an electrically conductive copper-containing region, the partially-completed interconnect structure having a substantially planar surface; depositing a metal (M) selected from the group consisting of manganese, chromium and vanadium on or into at least a portion of the electrically conductive copper-containing regions; depositing an insulating film on at least a part of the deposited metal, wherein the region of the deposited insulating film in contact with said at least a part of the deposited metal is substantially free of oxygen; and reacting at least a part of the deposited metal with the insulating film to form a barrier layer, wherein the electrically conductive copper-containing region is substantially free of elemental metal (M).

In other embodiments, the process includes: providing a partially-completed interconnect structure having a via or a trench, the via or trench including sidewalls defined by one or more electrically insulating materials and an electrically conductive copper-containing bottom region; depositing a metal (M) selected from the group consisting of manganese, chromium and vanadium on the partially-completed interconnect structure; forming second insulating sidewall regions through reaction of the deposited metal and said one or more electrically insulating materials; removing or diffusing away the metal from the bottom region to expose the electrically conductive copper-containing bottom region; and filling the via or trench with copper.

In other embodiments, the manganese may be replaced by chromium or vanadium.

In certain embodiments, a process is provided for the bottom-up filling of trenches or holes with copper or copper manganese alloy by a CVD method using manganese nitride as a underlayer and iodine as a surfactant catalyst. The copper or copper manganese alloy is deposited with a CVD method using appropriate vapor sources. Conformal deposition in sub-100 nm trenches can be achieved. Conformally deposited manganese nitride films show barrier properties against Cu diffusion and enhance adhesion between Cu and dielectric insulators. Release of adsorbed iodine atoms from the surface of manganese nitride films allows iodine to act as a surfactant catalyst floating on the surface of a growing copper layer. As the copper layer grows, iodine is continually released from the deposition interface to 'float' to the top of the growing copper layer and to serve as a surface catalyst for the next layer of copper to be deposited. As a result, void-free bottom-up filling of CVD of pure copper or copper-manganese alloy has been achieved in trenches narrower than 20 nm with aspect ratios over 9:1. Upon post-annealing, manganese in the alloy diffuses out from copper through the grain boundaries and forms a self-aligned layer to further improve adhesion and barrier properties at the copper/insulator interface. This process provides nanoscale interconnects for microelectronic devices with higher speeds and longer lifetimes.

Materials and techniques are provided to secure robust adhesion between the copper and the surrounding materials, to form barriers to prevent diffusion of copper out of the wiring, to prevent oxygen and water from corroding the copper, and to keep the copper wires from being damaged by the electric current that they carry.

In one embodiment, a partially completed interconnect structure having open trenches (that will contain wires) and holes (vias that will connect one level of wires with wires already formed) can be subjected to one or more CVD processes. CVD can be used to deposit manganese on the walls of the trenches and vias, as well as on exposed portions of any conductors already formed at the bottoms of the vias. Next, CVD can be used to chemisorb iodine onto the manganese-coated surfaces. Finally, CVD of copper can be carried out in such a way that iodine catalyzes the bottom-up filling of vias and trenches without any seams or voids.

In another embodiment, the a layer of manganese nitride ($MnN_x$, $0<x<1$) can be formed, followed by chemisorption of iodine on the manganese nitride, and followed by catalytically-enhanced CVD of void-free copper to fill the vias and trenches.

In other embodiments, a layer of manganese nitride ($MnN_x$, $0<x<1$) can be formed, followed by chemisorption of iodine and followed by catalytically-enhanced CVD of a thin layer of copper. Additional iodine can then be further chemisorbed onto the surface of this thin copper layer, followed by additional CVD of copper that may be even more efficiently catalyzed by the larger amount of iodine resulting from both chemisorption steps.

In still other embodiments, alternating steps of CVD manganese and CVD copper, resulting in filling of the trenches and vias with a copper-manganese nanolaminate can further be carried out. Heating this structure can permit diffusion of the manganese to nearby insulator surfaces, where it can increase the adhesion strength of the copper to the insulators and form a self-aligned barrier to diffusion of copper, water and oxygen. After the out-diffusion of manganese, the interconnect can become pure, highly conductive copper bonded strongly to the insulator surfaces by the manganese.

In other embodiments, after the initial manganese and iodine depositions, copper and manganese precursor vapors can simultaneously be introduced into the deposition zone of a CVD reactor, along with any necessary reducing agents, such as hydrogen, to deposit a void-free copper-manganese alloy.

In alternate embodiments, CVD can be used to form a thin layer comprising Mn, I and Cu, which can serve as a seed layer for electroplating Cu.

Precursors suitable for CVD of manganese include manganese amidinates, such as manganese(II) bis(N,N'-dialkylamidinates), which can be reduced with hydrogen to give manganese metal, or reacted with ammonia to deposit manganese nitride at low temperatures and with dense nucleation on insulator surfaces.

Many precursors are known for CVD of copper metal. Copper amidinates, such as copper(I) N,N'-dialkylamidinate dimers, are particularly suitable because their high thermal stability and high reactivity permit pure copper to be deposited by hydrogen reduction at low temperatures with dense nucleation on iodine-covered manganese or manganese nitride surfaces.

Other features and advantages of the invention will be apparent from the following description and accompanying figures, and from the claims.

DETAILED DESCRIPTION OF THE INVENTION

Figure 1:
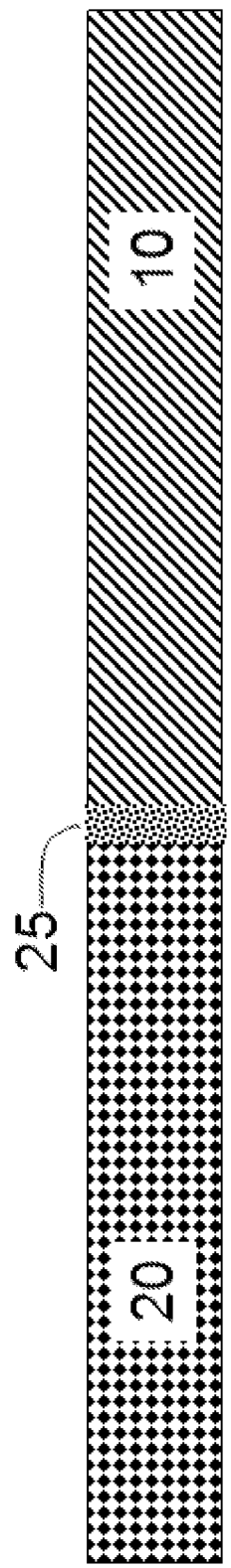
FIG. 1 is a schematic cross section of the top of a partially completed interconnect wiring structure in accordance with the invention, after a Chemical Mechanical Polishing (CMP) step.

A partially completed multi-level wiring structure for a microelectronic device is shown in FIG. 1. This structure comprises a substantially planar surface comprising insulating areas 10, e.g., silica, and electrically conducting areas 20, e.g., copper, forming the top of a completed lower level of wiring, separated by a diffusion barrier 25. In some embodiments, this diffusion barrier can comprise manganese silicate. Typically, the device at this stage has been processed by CMP followed by cleaning. It should be noted that although the discussion exemplifies the invention using Mn, other metal precursors that contain, for example, Co, Cr, or V, can just as easily be carried used.

Figure 2:
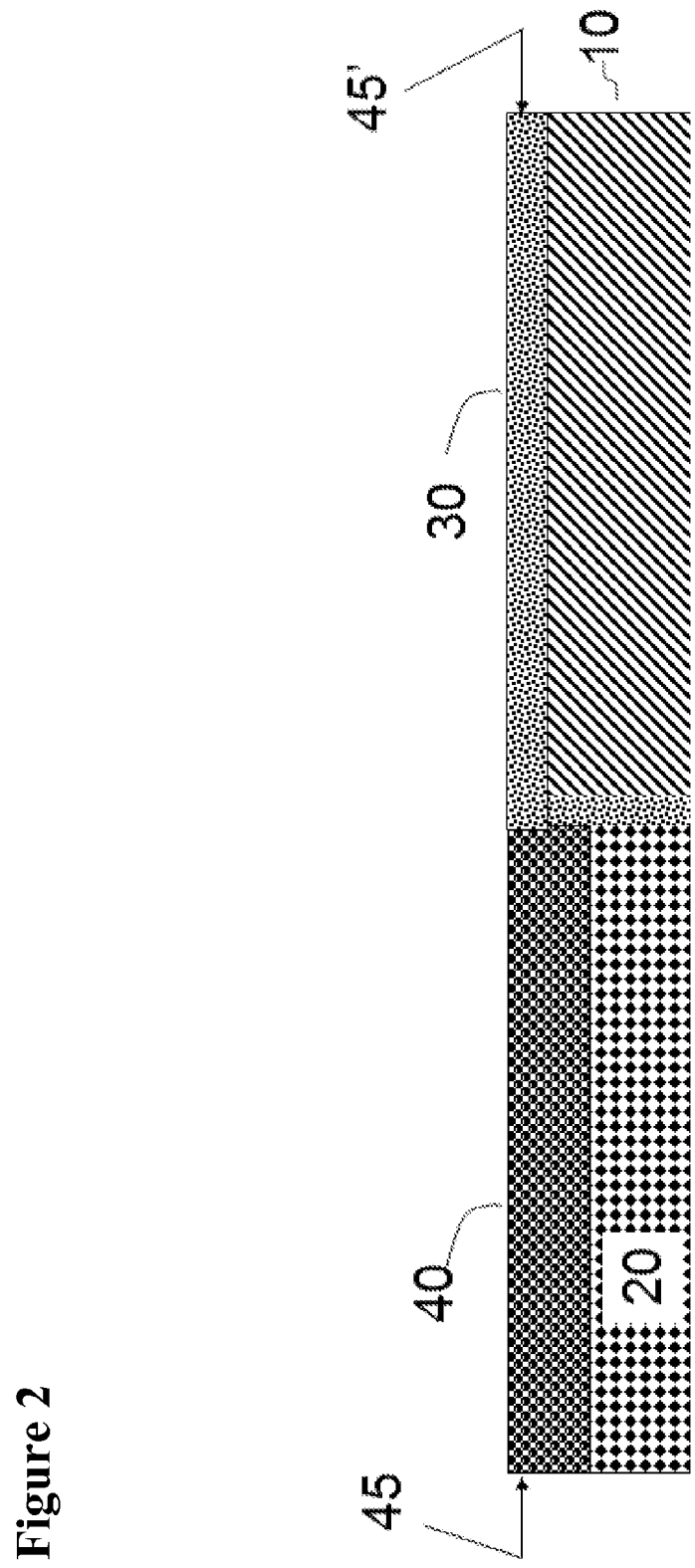
FIG. 2 is the structure of FIG. 1 after a metal deposition.

Next, as shown in FIG. 2, Mn (or Co, or Cr, or V) metal is deposited on the surface. The Mn reacts with the exposed areas of the insulator 10 to form an insulating $MnSi_xO_y$ layer marked 30 in FIG. 2. In the exposed Cu areas of the surface 20, the Mn diffuses into the upper portion of the Cu to form a CuMn alloy 40. The location of the upper surface prior to deposition is indicated by arrows 45, 45'. Typically, Mn is deposited on a heated substrate. If the temperature of the substrate is high enough (typically over 150° C.) and the deposition of Mn is slow enough, then the reaction and diffusion of the Mn may be complete by the end of the deposition. If the reaction with the insulator and the diffusion into the Cu are not complete during deposition, then a post-deposition anneal may be used to complete the reaction and diffusion.

Mn may be deposited by any convenient method, including chemical and physical methods. Chemical methods include chemical vapor deposition (CVD) and atomic layer deposition (ALD). Physical methods include sputtering and evaporation. Because the substrate is planar, step coverage by the deposition method is not critical to this step. Thus physical methods, which have poor step coverage, are adequate for this deposition step. CVD can also be used in this step whether or not the specific CVD process has good step coverage.

Figure 3:
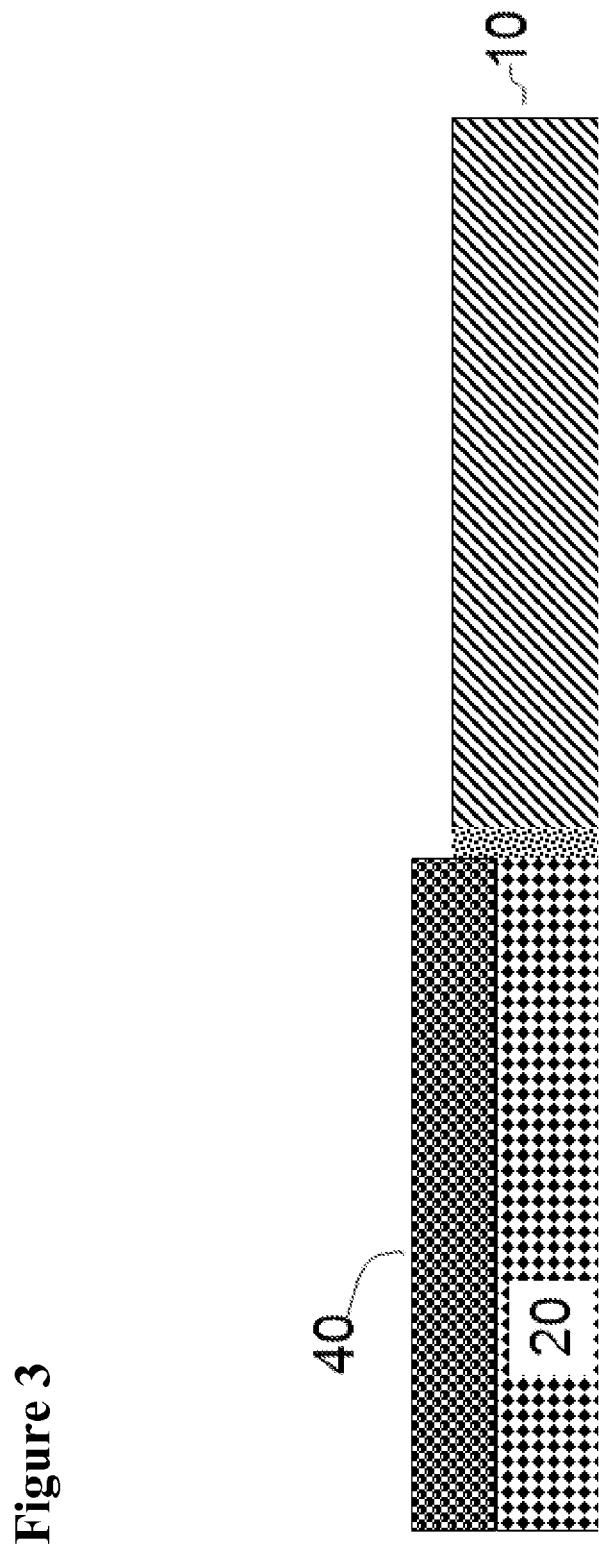
FIG. 3 is the structure of FIG. 2 after removal of metal silicate.

The $MnSi_xO_y$ layer 30 can optionally be removed after Mn deposition, as is shown in FIG. 3. The $MnSi_xO_y$ layer 30 formed in the last step is an electrical insulator, but its leakage current may be higher than desired in some applications. In such cases, this metal silicate layer 30 may be removed, in order to reduce the leakage current in devices. The silicate layer 30 may be removed by any convenient means, such as polishing, wet etching or dry etching. The removal may be non-selective, removing copper at the same rate as the silicate, thereby maintaining a flat surface. Alternatively, the silicate layer 30 may be removed selectively without removing copper, as is illustrated in FIG. 3. The resulting uneven surface requires a conformal method to deposit the blanket insulator in the next step.

Alternatively, rather than depositing Mn (or Co, or Cr, or V) on both the insulating and conductive surfaces of FIG. 1, the surfaces can be pretreated to selectively deposit manganese on the copper surfaces. As used herein, "selective deposition" refers to preferential deposition of a material onto one surface while little or no deposition occurs on a different surface. Accordingly, the surface can be pretreated to preferentially deposit manganese on the copper surface and to reduce or eliminate deposition of manganese on the insulator areas).

Reactive sites on the insulator surface can be deactivated using protecting agents prior to the CVD of manganese. This deactivation can be accomplished by reaction of the insulator surface with alkylsilane compounds either in the vapor phase or in solution. For example, effective deactivating compounds comprise dialkylamide groups bonded to silicon, such as bis(N,N-dialkylamino)dialkylsilanes and N,N-dialkylaminotrialkylsilanes. Exemplary reagents of these two types include bis(N,N-dimethylamino)dimethylsilane, $(CH_3)_2Si(N(CH_3)_2)_2$, and (N,N-dimethylamino)trimethylsilane, $(CH_3)_3SiN(CH_3)_2$.

In certain embodiments, the deactivation can be accomplished by reaction of the insulator surface with two or more alkylsilane compounds either in the vapor phase or in solution to synergistically reduce reactivity of the insulating surfaces. As used herein, "synergistic" means that the use of the two or more protecting agents leads to a greater deactivation effect as compared to the deactivation effect obtained by use of the individual protecting agents.

In certain embodiments, complete prevention of manganese or cobalt deposition on the insulators has been achieved by the sequential exposure of an insulator surface to a bis(N,N-dialkylamino)dialkylsilane and then to a N,N-dialkylaminotrialkylsilane. Under the same reaction conditions, it has been discovered that neither of these types of deactivating compounds reacts with a clean, oxide-free copper surface. Thus CVD of manganese or cobalt on copper surfaces is not prevented by these reagents.

Thereafter, a manganese amidinate vapor and hydrogen gas are brought into contact with a heated substrate. On parts of the substrate surface that are composed of copper 20, a thin, continuous layer of copper-manganese alloy 40 is formed near the surface of the copper. On parts of the substrate surface made of insulators 10, such as $SiO_2$ or SiCOH, little or no manganese is deposited. In certain embodiments, the temperature of the heated surface can be in a suitable range, typically 200 to 350° C., or more preferably 250 to 300° C.

As noted above, other metals, such as Co, Cr, or V, can be selectively deposited over the copper surfaces. For example, cobalt metal can be deposited on copper surfaces, while little or no cobalt is deposited on insulator surfaces. In such embodiments, a cobalt amidinate vapor and hydrogen gas are brought into contact with a heated substrate. On parts of the substrate surface that are composed of copper 20, a thin, continuous layer of cobalt 40 is formed on the surface of the copper. On parts of the substrate surface made of insulators 10, such as $SiO_2$ or SiCOH, little or no cobalt is deposited. In certain embodiments, the temperature of the heated surface can be in a suitable range, typically 180 to 250° C., or more preferably 200 to 220° C.

Figure 4:
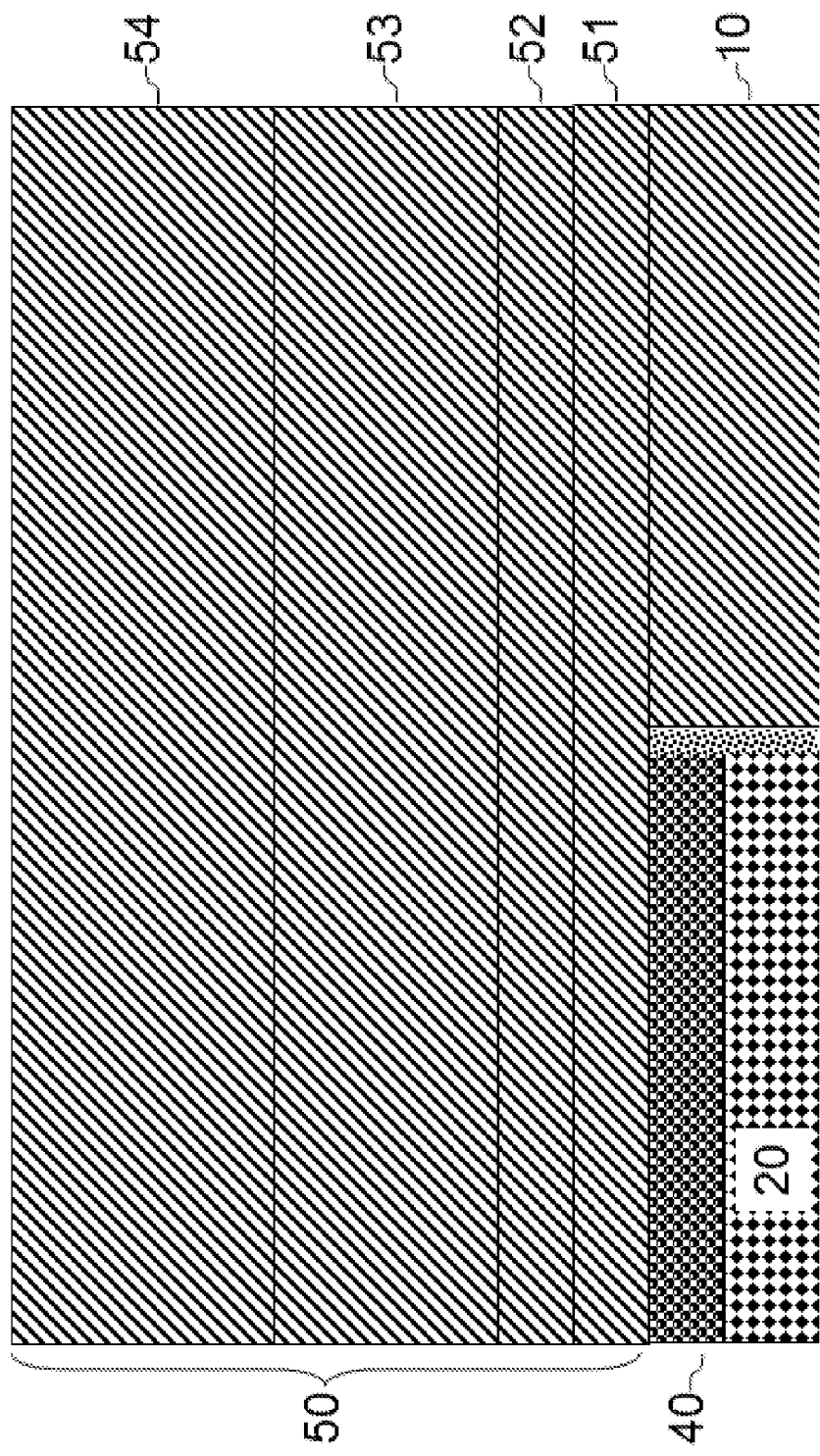
FIG. 4 is the structure of FIG. 3 after a blanket insulator is deposited.

A blanket insulator layer 50 is next deposited on the structure shown in FIG. 3 (either with or without planarization), as shown in FIG. 4. Note that the structure in FIG. 4 does not include the silicate layer 30 above insulating layer 10. Any of the methods known in the art may be used to make this insulator layer, including plasma-enhanced CVD or spin coating. Insulator compositions comprising Si and O may be used. In certain embodiments, insulator compositions comprising Si but which is substantially free of O, such as SiN, SiC, SiCN, and the like, may be used. In certain embodiments, insulator layers can be built up by deposition of several sub-layers of insulating material, each adding a specific functionality to the overall insulating layer. For example, a first insulating sub-layer 51 which enhances adhesion to the manganese-doped copper layer underneath it, such as a $Si_3N_4$, may be used. In certain embodiments, sub-layer 51 may be substantially free of oxygen. In certain embodiments, sub-layer 51 that is substantially free of oxygen may enhance adhesion to the manganese-doped copper layer over than that obtained by adhesion of a sub-layer 51 which comprises oxygen. Next an etch-stop sub-layer 52, such as silicon carbide, may be deposited on top of sub-layer 51. The etch-stop sub-layer 52 can help to define the proper depth for etching of the holes (vias). In certain embodiments, the next insulating sub-layer 53 may be a porous dielectric with a very low dielectric constant (typically k less than about 2.5). The final insulating sub-layer 54 may be a denser non-porous dielectric with a higher dielectric constant (k greater than about 2.5), which can help to protect the more fragile porous dielectric layer from mechanical damage, as well as keeping water from entering into the pores of the porous dielectric. In certain embodiments, sub-layers 53 and 54 may contain Si and O. Another function of the sub-layer 53 may be as an etch-stop layer for defining the bottoms of trenches through the sub-layer 54. As would be readily apparent to one of ordinary skill in the art, numerous variations for the specific insulator layer 50 (such as thickness, layer combinations, material compositions, etc.) are within the scope of the present invention. For simplicity, any reference to insulating layer 50 in the present application should be understood to encompass one or more of the sub-layers described herein.

Figure 5:
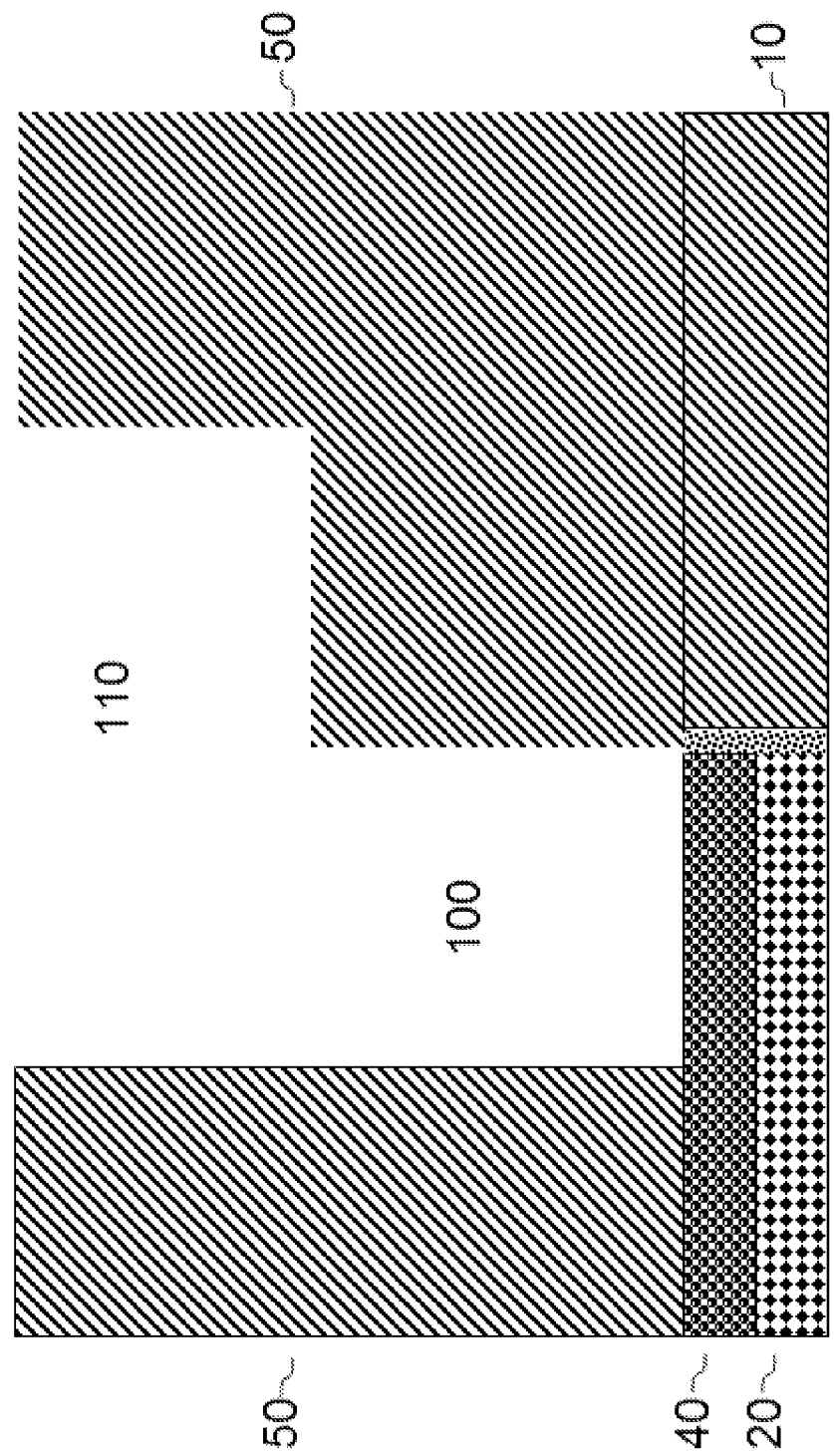
FIG. 5 is the structure of FIG. 4 after lithography and etching of vias and trenches in the insulator.

Lithography and etching are used to pattern holes (vias) 100 and trenches 110 into the insulator layer 50. A schematic cross section of the resulting structure is shown in FIG. 5.

Figure 6:
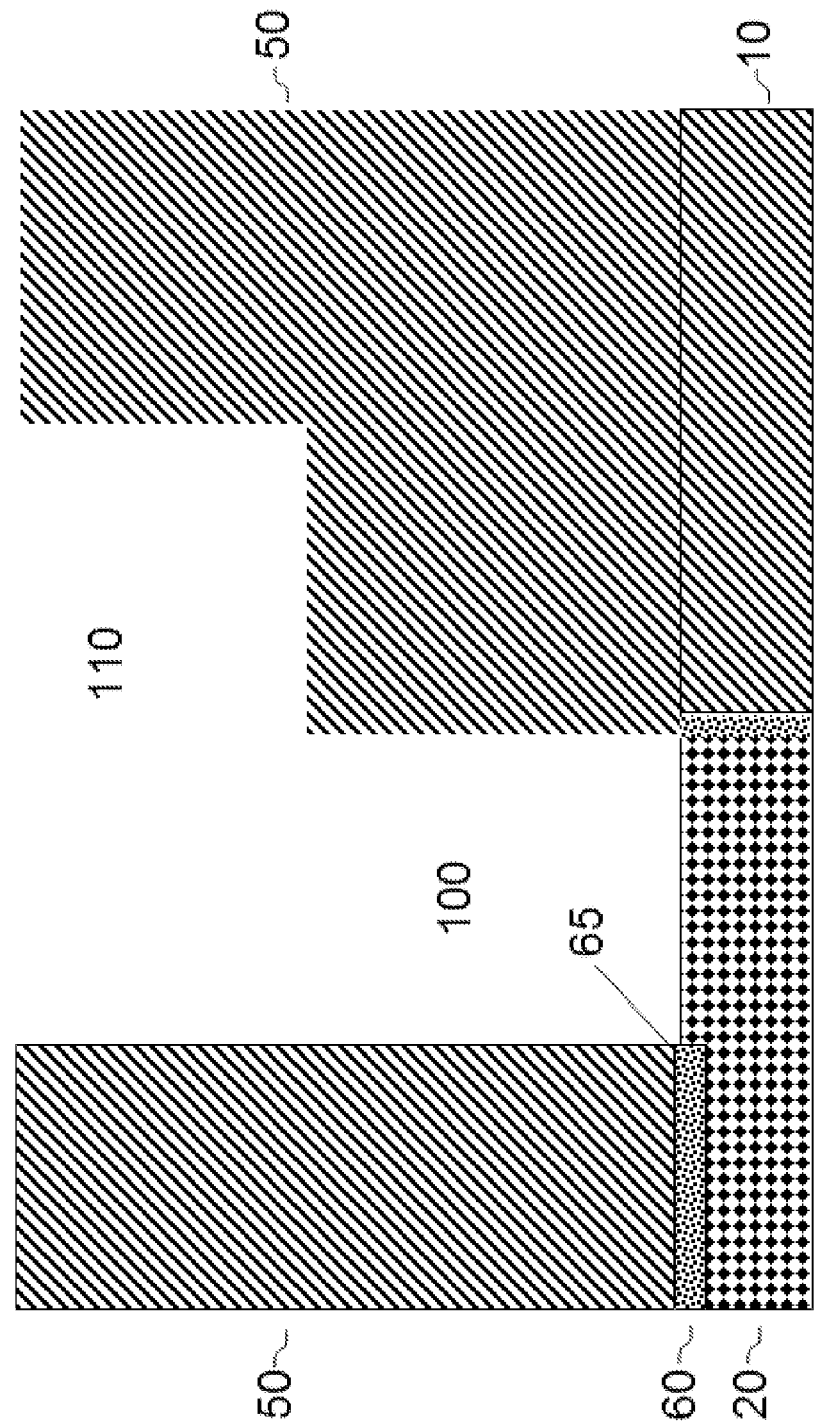
FIG. 6 is the structure of FIG. 5 after an anneal.

This structure is annealed to form a $MnSi_xN_y$ layer 60 (assuming the use of $Si_3N_4$ as sub-layer 51) at the interface between the insulating silica layer 50 and the CuMn alloy layer 40, as shown in FIG. 6. The $MnSi_xN_y$ layer 60 serves as a barrier against diffusion of Cu out of the layer 20 and also provides strong adhesion between the Cu 20 and the insulator 50. The $MnSi_xN_y$ can also serve to prevent diffusion of oxygen or water from the insulator layer 50 into the Cu layer 20. After anneal, most of the Mn from the Mn—Cu alloy layer 40 is located in the $MnSi_xN_y$ layer 60; however, some Mn may migrate during anneal to the upper surface of the layer 20 to form a manganese oxide layer (not shown). Any manganese oxide remaining on the Cu surface may be removed by directional sputtering, or by selective etching by a vapor such as formic acid or by a liquid acid solution. This is indicated by the slight recession 65 between the upper surface of Cu layer 20 and adjacent $MnSi_xN_y$ layer 60.

Figure 7:
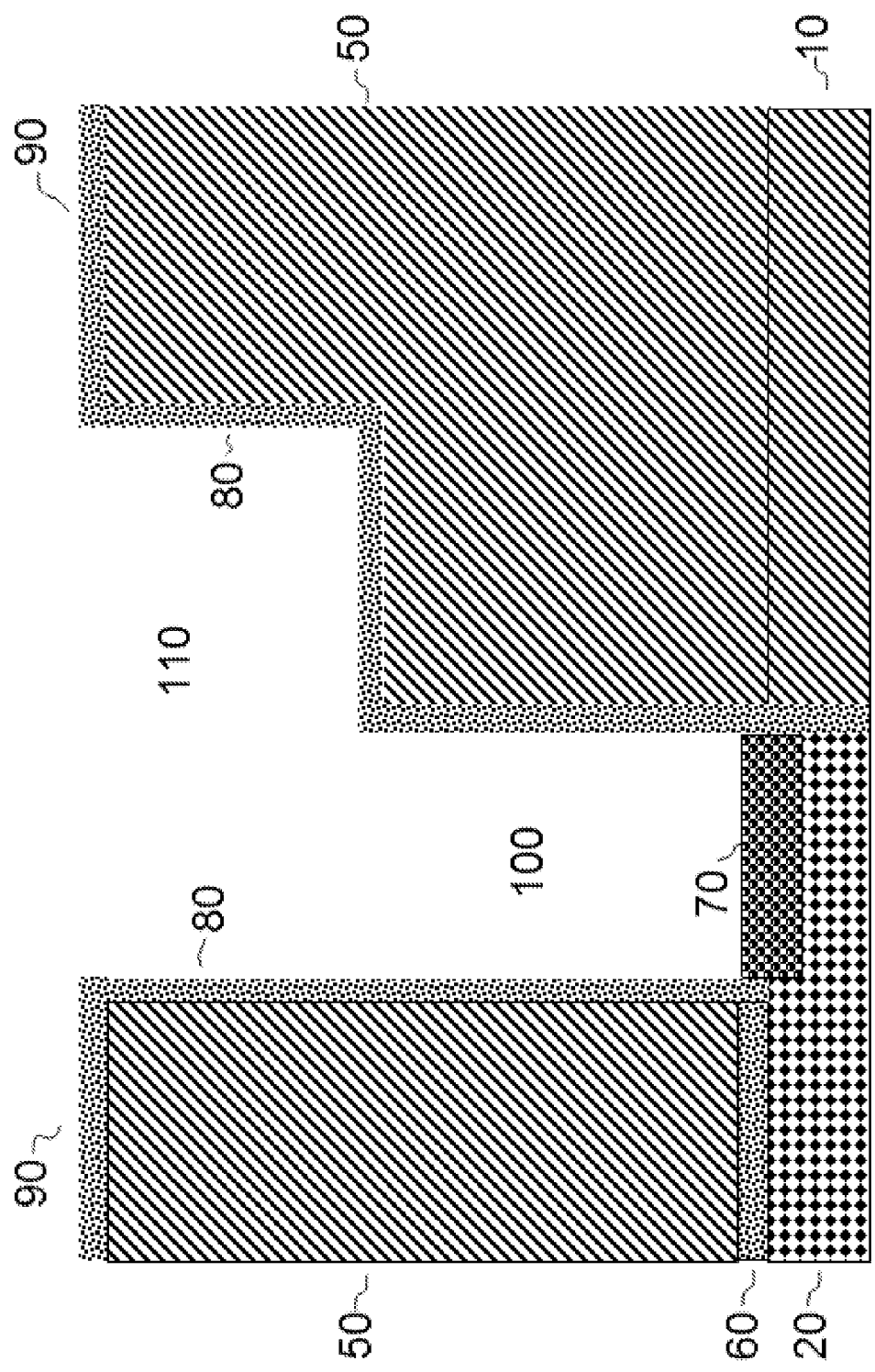
FIG. 7 is the structure of FIG. 6 after another metal deposition.

Another layer of Mn is deposited next, preferably by a conformal method such as CVD or ALD. This step forms a layer 80 on the walls of the vias and trenches, which can vary from $MnSi_xO_y$ near the top and $MnSi_xN_y$ near the bottom if using silica as sub-layer 54 and silicon nitride as sub-layer 51. This step can further form a top layer of $MnSi_xO_y$ 90 on the upper surface of insulator layer 50, as shown in FIG. 7. A CuMn alloy layer 70 forms initially on the exposed copper surface of layer 20, but then the Mn diffuses to form more of the insulator surfaces such as layer 60. If the formation of these layers is not complete by the end of the deposition, an additional anneal and possibly an acid etch is used to form the structure shown in FIG. 8, in which the copper 20 layer is substantially free of Mn impurity.

In certain embodiments, manganese nitride, $MnN_x$, may also be deposited on the exposed surfaces of vias 100 and trenches 110. In some other embodiments, manganese nitride, $MnN_x$, may also be deposited on layers 70, 80 and 90. Surprisingly, the use of manganese nitride was found to provide at least five beneficial functions. First, the manganese nitride can increase the strength of adhesion between the insulating material and subsequently-deposited copper. Second, the manganese nitride can serve as an effective barrier layer against diffusion of copper, oxygen, and water. Third, the manganese nitride can enhance capture and release of a surface catalyst, such as iodine or bromine, as discussed in greater detail below. These three benefits of $MnN_x$ are similar to those conferred by manganese metal. As an additional fourth benefit, manganese nitride deposits more continuously and uniformly over a surface than pure manganese metal does, because we discovered that $MnN_x$ is more resistant to agglomeration than Mn is. The manganese nitride is preferably deposited by a conformal method, such as CVD, ALD or ionized physical vapor deposition (IPVD). Fifth, we found that CVD and ALD of $MnN_x$ can be accomplished at lower temperatures and at a higher rate than deposition of manganese metal. If it is desirable to use continuous and non-agglomerated manganese metal, it may be formed conveniently by removing nitrogen from manganese nitride, for example by the use of a hydrogen plasma.

Figure 9:
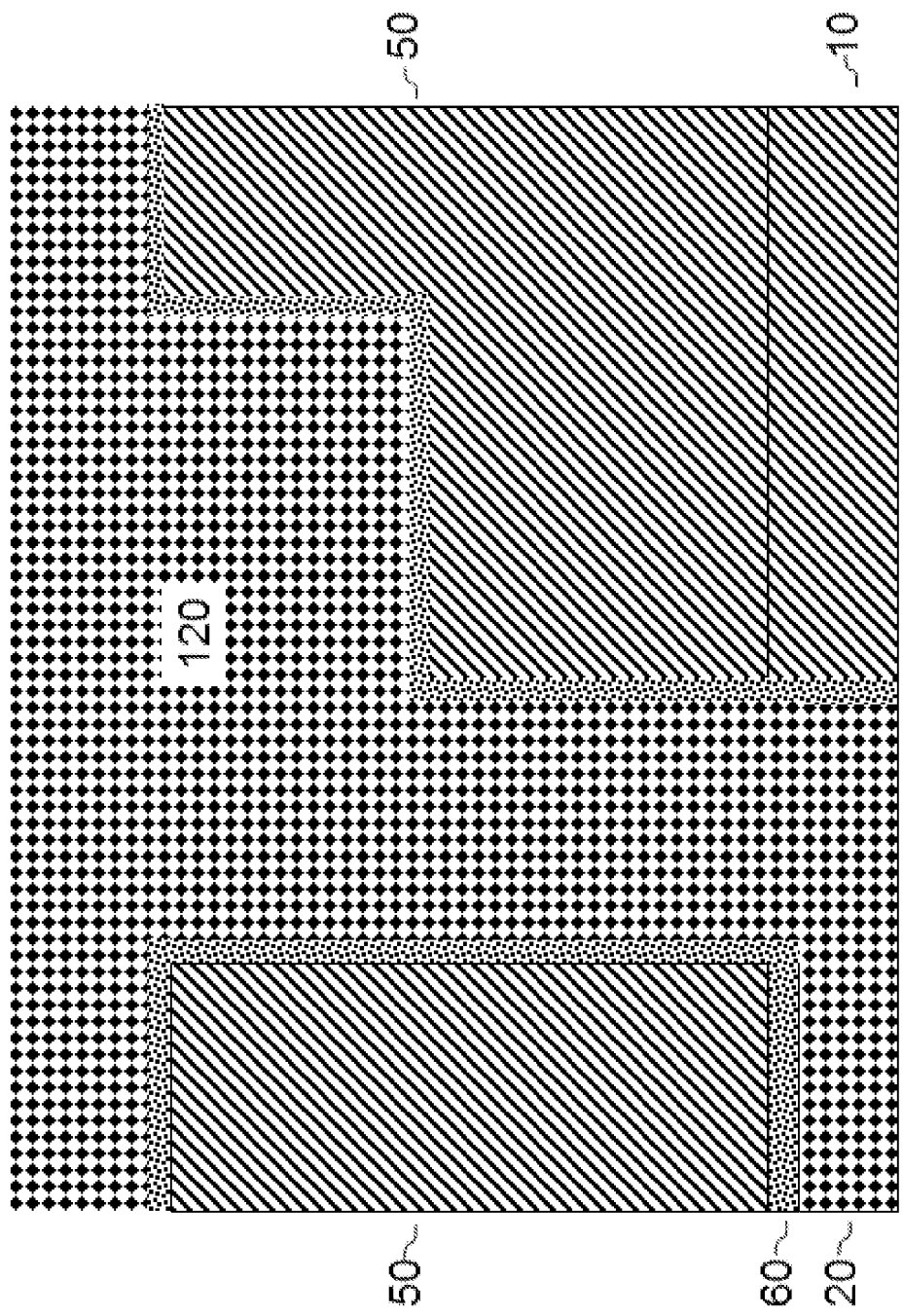
FIG. 9 is the structure of FIG. 8 after seed layer deposition and filling with copper.

Next, a seed layer of Cu is formed, preferably by a conformal method such as CVD, ALD or IPVD. Then the vias and trenches are filled by electroplating to form the structure shown in FIG. 9. This pure Cu layer 120 is annealed to increase the grain size and reduce the resistance.

Figure 8:
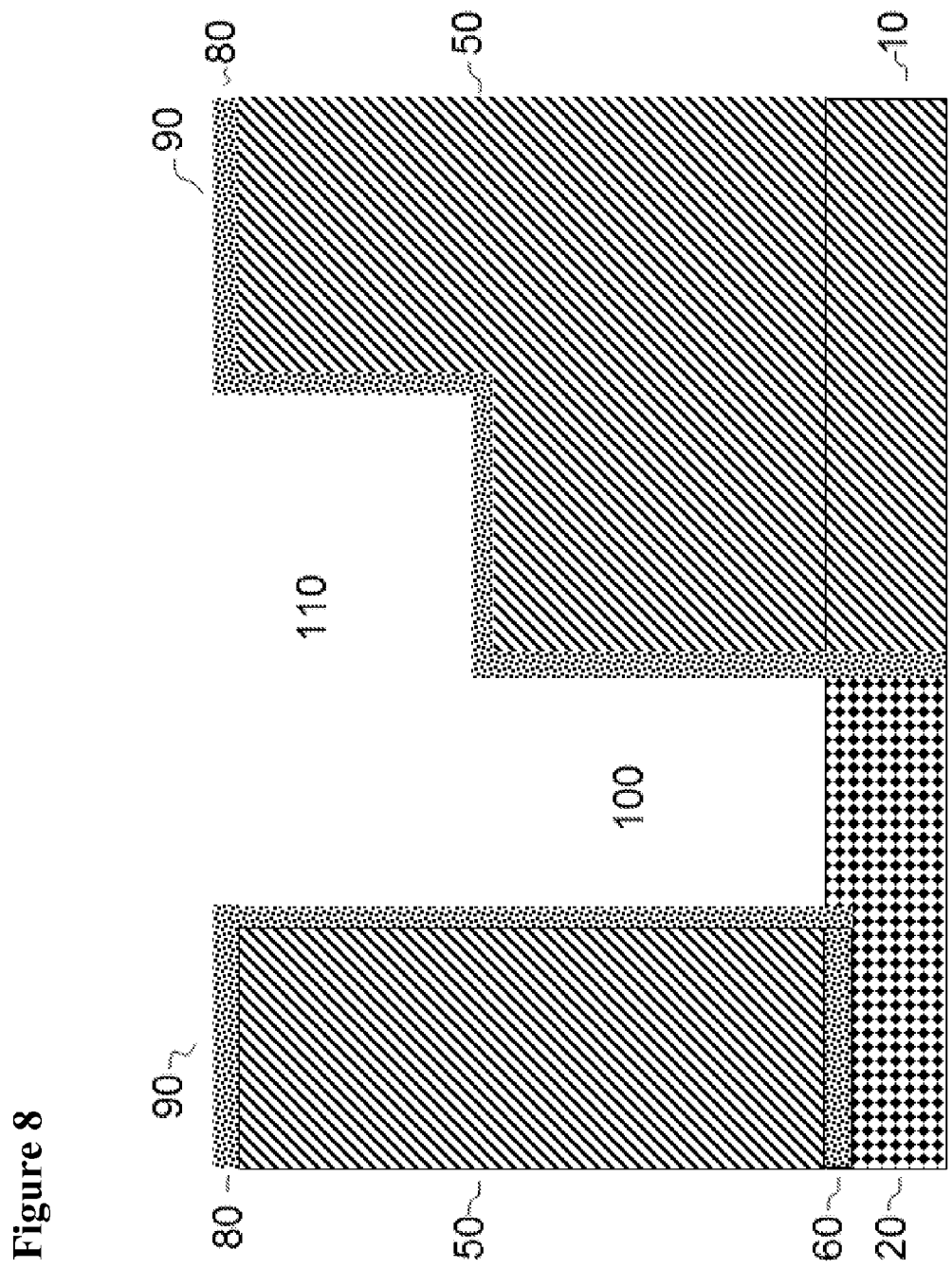
FIG. 8 is the structure of FIG. 7 after an anneal.

In certain alternative embodiments, copper can be catalytically grown in vias and trenches, such as vias and trenches having a structure similar to that shown in FIG. 8, vias and trenches having the sidewalls and bottom surface deposited with a manganese containing layer, such as manganese nitride layer, or vias and trenches having an insulator surface, such as silica.

In certain embodiments, the vias and trenches may be exposed to a manganese containing precursor to form a manganese containing layer. After the formation of a manganese containing layer (e.g., through a vapor deposition technique such as CVD), iodine or bromine containing precursor, such as ethyl iodide, methyl iodide, di-iodomethane molecular iodine ($I_2$), bromoethane, or molecular bromine ($Br_2$), can be introduced to adsorb or chemisorb onto the manganese containing surfaces. Thereafter, copper can be catalytically grown using a vapor deposition technique, such as CVD.

Without wishing to be bound by theory, the iodine or bromine containing precursor may act as a catalyst for the growth of copper for the following reasons, which one of ordinary skill in the art would not have expected. Taking iodine as an example, the bond strength between an iodine atom and a manganese atom is known to be much larger than the bond strength between iodine and copper, at least in the gas phase. (The data can be found in the CRC Handbook of Chemistry and Physics: $D°_{298}=197\pm 21$ kJ/mol for Cu—I and $D°_{298}=282.8\pm 9.6$ kJ/mol for Mn—I). Therefore, one of ordinary skill in the art would have expected that a small amount of iodine catalyst (less than a monolayer) would be held strongly by the manganese atoms. While the strong iodine-manganese bond may be desirable to allow iodine to attach to the Mn surface and initiate the subsequent growth of copper, the iodine attached to the manganese would not be able to float to the copper surface and thus would not be able to catalyze the copper deposition reactions on its surface. Accordingly, in certain embodiments, the presence of other components, such as nitrogen in the manganese film, might be able to weaken the manganese-iodine bonds by a sufficient amount so that the iodine can be released to the copper film. As noted above, the $MnN_x$—I bonds nevertheless must also be strong enough to catch the iodine from the gas phase during the initial chemisorption of the iodine. Discovering the suitable combination of properties that allow initial chemisorption followed by release from the Mn containing surface required extensive efforts and was not readily apparent to the inventors. For example, other materials, such as silicon dioxide and titanium nitride, fail to chemisorb the iodine while other materials, such as cobalt and nickel, readily chemisorb the iodine but then fail to release it.

After the iodine or bromine containing precursor has been deposited onto the manganese containing layer, a copper layer can be formed using techniques such as CVD, ALD or IPVD.

In certain embodiments, after the first iodine or bromine containing precursor has been deposited onto the manganese containing layer, manganese and copper containing precursors can be co-deposited, either as mixed precursors or separate precursors to form a copper-manganese alloy.

In some other embodiments, after the first iodine or bromine containing precursor has been deposited onto the manganese-containing layer, manganese, copper, and iodine/bromine containing precursors can be co-deposited, either as mixed precursors or separate precursors to form a copper-manganese alloy where the additional iodine/bromine can serve to ensure or even further promote the catalytic growth of the copper-manganese alloy.

In certain embodiments, electroplating of copper can be performed after deposition of copper or copper-manganese alloy described above.

After the Cu or Cu—Mn alloy has been deposited and/or electroplated, the Cu or Cu—Mn alloy layer 120 can be annealed to increase the grain size and reduce the resistance.

Figure 10:
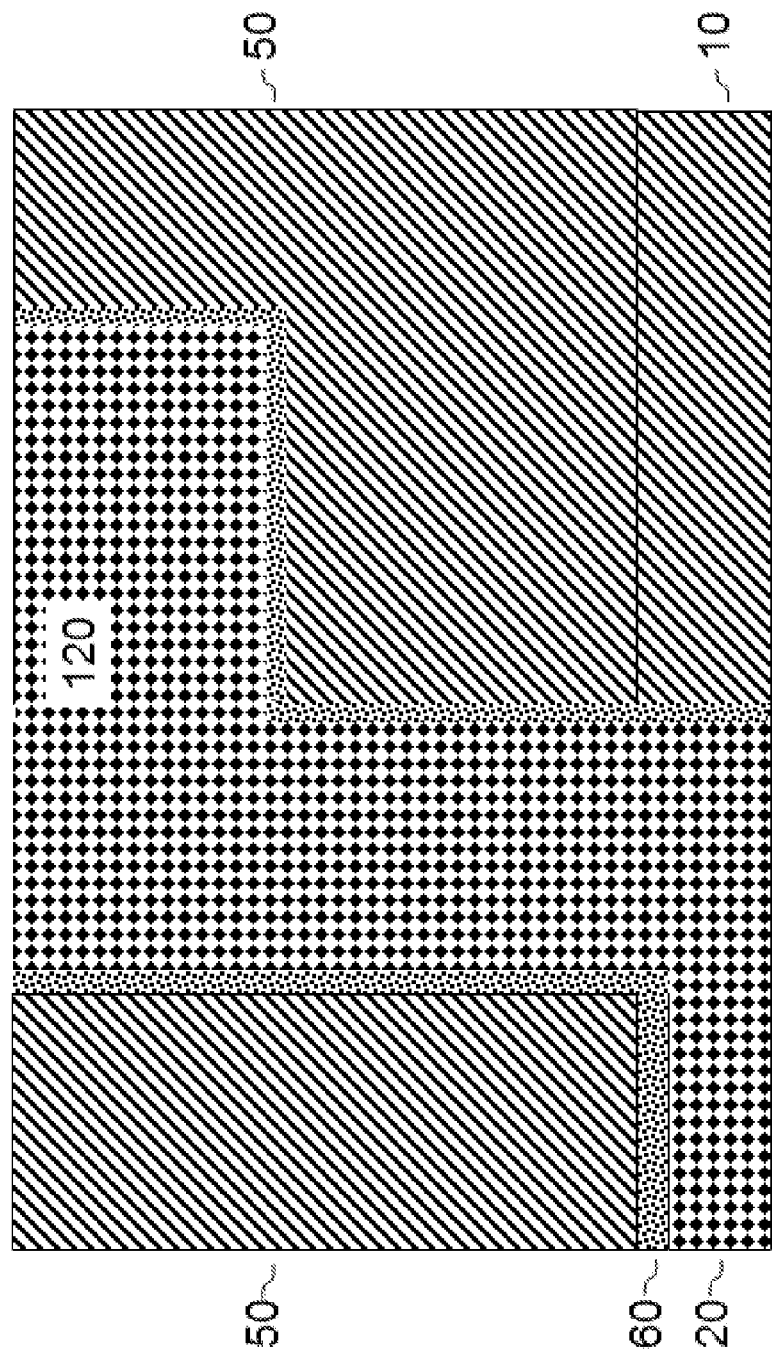
FIG. 10 is the structure of FIG. 9 after Chemical Mechanical Polishing.

Finally the excess copper is removed by CMP to create the structure shown in FIG. 10. This stage corresponds to the structure of FIG. 1, with one more stage of wiring completed.

In one or more embodiments, vapor deposition is used to deposit a metal M selected from the group of Mn, Co, Cr and V. Metal amidinate compounds of the formula $[M(AMD)_m]_n$ may be used as precursors, where AMD is an amidinate ligand and typically m=2 or 3 and n=1 or 2. For the case m=2 and n=1, these compounds may have the following structure:

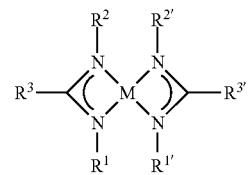

in which $R^1$, $R^2$, $R^3$, $R^{1'}$, $R^{2'}$ and $R^{3'}$ are groups made from one or more non-metal atoms, such as hydrogen, hydrocarbon groups, substituted hydrocarbon groups, and other groups of non-metallic atoms. In one CVD method for depositing Mn, a manganese amidinate vapor is brought into contact with a heated substrate. Where the substrate is Cu, a CuMn alloy is formed. Where the substrate contains silicon and oxygen, an insulating surface layer of $MnSi_xO_y$ is formed. In order for these layers to be formed, the temperature of the heated surface should be sufficiently high, typically over 150° C., or preferably over 300° C.

In one or more embodiments, the Mn-containing precursor can be a manganese amidinate having the formula, [Mn(AMD)$_m$]$_n$, where AMD is an amidinate and m=2 or 3 and n can range from 1 to 3. Some of these compounds for m=2, n=1 have a structure 1,

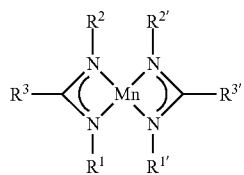

1 in which R$^1$, R$^2$, R$^3$, R$^{1'}$, R$^{2'}$ and R$^{3'}$ are groups made from one or more non-metal atoms, such as hydrogen, hydrocarbon groups, substituted hydrocarbon groups, and other groups of non-metallic atoms. In some embodiments, R$^1$, R$^2$, R$^3$, R$^{1'}$, R$^{2'}$ and R$^{3'}$ may be chosen independently from hydrogen, alkyl, aryl, alkenyl, alkynyl, trialkylsilyl, alkylamide or fluoroalkyl groups or other non-metal atoms or groups.

Exemplary hydrocarbon groups include $C_1$-$C_6$ alkyl, $C_2$-$C_6$ alkenyl and $C_2$-$C_6$ alkynyl groups. They can be branched or unbranched.

"Alkyl group" refers to a saturated hydrocarbon chain that may be a straight chain or branched chain or a cyclic hydrocarbon group, containing the indicated number of carbon atoms. For example, $C_1$-$C_6$ indicates that the group may have from 1 to 6 (inclusive) carbon atoms in it. Examples of alkyl groups include, but are not limited to, ethyl, propyl, isopropyl, butyl, and tert-butyl groups. Examples of cyclic alkyl groups include, but are not limited to, cyclopropyl, cyclopropylmethyl, cyclobutyl, cyclopentyl, cyclohexyl, cyclohexylmethyl, cyclohexylethyl, and cycloheptyl groups.

"$C_2$-$C_6$ alkenyl group" refers to a straight or branched chain unsaturated hydrocarbon containing 2-6 carbon atoms and at least one double bond. Examples of a $C_2$-$C_6$ alkenyl group include, but are not limited to, groups derived by removing a hydrogen from ethylene, propylene, 1-butylene, 2-butylene, isobutylene, sec-butylene, 1-pentene, 2-pentene, isopentene, 1-hexene, 2-hexene, 3-hexene, and isohexene.

"$C_2$-$C_6$ alkynyl group" refers to a straight or branched chain unsaturated hydrocarbon group containing 2-6 carbon atoms and at least one triple bond. Examples of a $C_2$-$C_6$ alkynyl group include, but are not limited to, groups derived by removing a hydrogen from acetylene, propyne, 1-butyne, 2-butyne, isobutyne, sec-butyne, 1-pentyne, 2-pentyne, isopentyne, 1-hexyne, 2-hexyne, and 3-hexyne.

"Substituted hydrocarbon group" refers to a saturated or unsaturated, straight or branched chain hydrocarbon containing 1-6 carbon atoms that can be further substituted with other functional groups, such as halogen or boron, or boron-containing groups.

"Halogen" refers to an atom of fluorine, chlorine, bromine, or iodine. Halogenated hydrocarbons include fluorinated, chlorinated or brominated alkyl. Exemplary fluorinated hydrocarbons include fluoroalkyl, fluoroalkenyl and fluoroalkynyl groups and combinations thereof.

"Groups of non-metallic atoms" include nitrogen-containing and silicon-containing groups. Exemplary nitrogen-containing R groups include amines (NR'R"), in which R' and R" include one or more of H, $C_1$-$C_6$ alkyl, $C_2$-$C_6$ alkenyl or $C_2$-$C_6$ alkynyl group and combinations thereof.

Exemplary silicon-containing R groups include silyl groups (SiR'R"R'''), in which R', R" and R''' include one or more of H, $C_1$-$C_6$ alkyl, $C_2$-$C_6$ alkenyl or $C_2$-$C_6$ alkynyl group and combinations thereof.

In some embodiments, R$^1$, R$^2$, R$^3$, R$^{1'}$, R$^{2'}$ and R$^{3'}$ are each independently alkyl or fluoroalkyl or silylalkyl groups or alkylamide groups. In some embodiments, the R" groups contain 1 to 4 carbon atoms. In other embodiments, the Mn precursor is an oligomer of structure 1, with n=2 or more. The manganese amidinate may comprise manganese(II) bis(N,N'-diisopropylpentylamidinate), corresponding to taking R$^1$, R$^2$, R$^{1'}$ and R$^{2'}$ as isopropyl groups, and R$^3$ and R$^{3'}$ as n-butyl groups in the general formula 1.

In a CVD method, bis(N,N'-diisopropylpentylamidinato)manganese(II) vapor is flowed over a surface that has been heated to a temperatures of 100 to 500° C., or more preferably 150 to 400° C. A CuMn alloy is formed on the exposed copper surfaces. A MnSi$_x$O$_y$ layer is formed as a diffusion barrier over the insulating areas. In some embodiments, the manganese content of the MnSi$_x$O$_y$ layer and the CuMn layer is equivalent to a manganese metal film with thickness of 1 to 10 nm, or more preferably a thickness of 2 to 5 nm. Alternatively, the vapor is mixed with dihydrogen gas (H$_2$) at a temperature above 90° C. and used for the CVD process.

Manganese amidinates may be made by any conventional method. See, e.g., WO 2004/046417, which is incorporated by reference in its entirety.

In one or more embodiments, the metal precursor may include cyclopentadienyl and carbonyl ligands, corresponding to the general formula (Cp)$_q$M$_r$(CO)$_s$ where Cp is an cyclopentadienyl radical substituted by up to five groups, and q, r, and s can be any positive integer. These compounds may have the following structure:

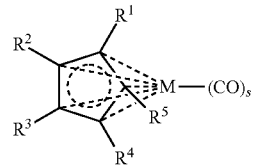

In one or more embodiments, the Mn-containing precursor can be a manganese cyclopentadienyl tricarbonyl having the formula, (Cp)Mn(CO)$_3$. Some of these compounds have a structure 2,

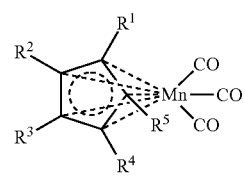

2 in which the R$^1$, R$^2$, R$^3$, R$^4$, and R$^5$ groups are made from one or more non-metal atoms, such as hydrogen, hydrocarbon groups, substituted hydrocarbon groups, and other groups of non-metallic atoms, as described herein above. In some embodiments, R$^1$, R$^2$, R$^3$, R$^4$, and R$^5$, may be chosen independently from hydrogen, alkyl, aryl, alkenyl, alkynyl, trialkylsilyl or fluoroalkyl groups or other non-metal atoms or groups. In some embodiments, R$^1$, R$^2$, R$^3$, R$^4$ and R$^5$ are each independently alkyl or fluoroalkyl or silylalkyl groups or alkylamide groups. In some embodiments, the R″ groups contain 1 to 4 carbon atoms. A preferred compound of this type is commercially available methylcyclopentadienylmanganese tricarbonyl, (MeCp)Mn(CO)$_3$, in which R$^1$ is a methyl group and the other R‴'s are hydrogen.

In one or more embodiments, the metal precursor may include two Cp ligands, with formula M(Cp)$_2$ where Cp is a cyclopentadienyl radical substituted by up to five groups. These compounds may have the following structure:

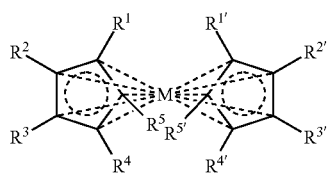

In one or more embodiments, the Mn-containing precursor can be a manganese cyclopentadienyl having the formula, Mn(Cp)$_2$. Some of these compounds have the formula 3,

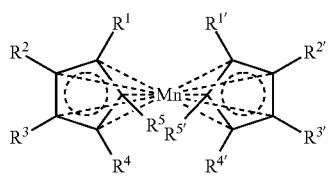

in which R$^1$, R$^2$, R$^3$, R$^4$, R$^5$, R$^{1'}$, R$^{2'}$, R$^{3'}$, R$^{4'}$ and R$^{5'}$ are groups made from one or more non-metal atoms, such as hydrogen, hydrocarbon groups, substituted hydrocarbon groups, and other groups of non-metallic atoms, as described herein above. In some embodiments, R$^1$, R$^2$, R$^3$, R$^4$, R$^5$, R$^{1'}$, R$^{2'}$, R$^{3'}$, R$^{4'}$ and R$^{5'}$ may be chosen independently from hydrogen, alkyl, aryl, alkenyl, alkynyl, trialkylsilyl or fluoroalkyl groups or other non-metal atoms or groups. In some embodiments, R$^1$, R$^2$, R$^3$, R$^4$, R$^5$, R$^{1'}$, R$^{2'}$, R$^{3'}$, R$^{4'}$ and R$^{5'}$ are each independently alkyl or fluoroalkyl or silylalkyl groups or alkylamide groups. In some embodiments, the R″ groups contain 1 to 4 carbon atoms.

In certain embodiments, the manganese precursor bis(N, N'-diisopropylpentylamidinato)manganese(II) may be prepared as described in US Patent Application US 2009/0263965, the contents of which is incorporated by reference in its entirety, or obtained from the Dow Chemical Company. Its chemical formula is shown below:

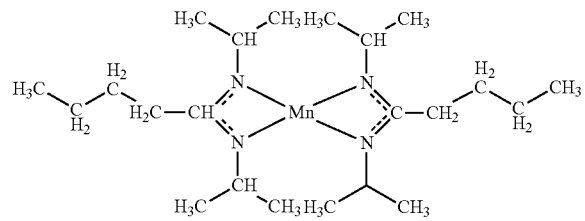

Iodine precursors, such as ethyl iodide or elemental I$_2$ are commercially available from many commercial sources.

A Cu layer (a seed layer or a full layer) may be deposited conformally by methods such as CVD or ALD. ALD methods are described, for example, by Zhengwen Li, Antti Rahtu and Roy G. Gordon in the Journal of the Electrochemical Society, volume 153, pages C787-C794 (2006) and by Zhengwen Li and Roy G. Gordon in the journal Chemical Vapor Deposition, volume 12, pages 435-441 (2006). CVD methods are described in the paper by Hoon Kim, Harish B. Bhandari, Sheng Xu and Roy G. Gordon, which was published in the Journal of the Electrochemical Society, volume 155, issue 7, pages H496-H503 (2008). In this reference, smooth thin layers of copper oxynitride or copper oxide are first deposited using conventional vapor deposition techniques and then the deposited layers are reduced to smooth copper films by reduction with a hydrogen plasma at room temperature. Another method for reducing copper oxide films to copper metal is by reaction with liquid solutions of reducing agents such as dimethylamineborane or metal borohydrides.

In certain embodiments, the copper precursor copper N,N'-di-sec-butylacetamidinate may be utilized, which can be prepared as described in Inorganic Chemistry, volume 44, pages 1728-1735 (2005), the contents of which is incorporated by reference in its entirety, or obtained from the Dow Chemical Company. Its chemical formula is shown below:

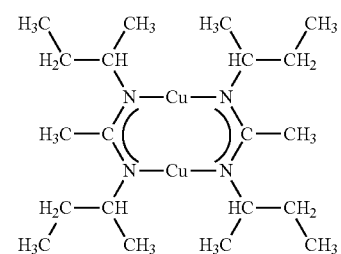

Other copper compounds can also be used for the iodine-catalyzed CVD of copper, including copper beta-diketonates, copper beta-ketoiminates, copper diketiminates, copper cyclopentadienyls, copper alkoxides and copper aminoalkoxides. Specific examples of these general classes include 1,1,1,5,5,5-hexafluoro-2,4-pentadionato copper(I) vinyltrimethylsilane (sometimes known as (hfac)CuVTMS), 1,1,1,5,5,5-hexafluoro-2,4-pentadionato copper(I) (3,3-dimethyl-1-butene) (sometimes known as (hfac)CuDMB), bis(1,1,1,5,5,5-hexafluoro-2,4-pentadionato) copper(II) (sometimes known as Cu(hfac)$_2$), (N(1(dimethylvinylsiloxy)-1-methylethano)-2-imino-4-pentanoato)copper(I) (a copper ketominate), (N(2(vinyldimethylsiloxy)propyl)-2-imino-4-pentenoato) copper(I), bis[[2-(4,5-dihydro-3H-pyrrol-yl)-1-methyl-vinyl]ethyl-aminate]copper(II) (a copper diketiminate) and methylcyclopentadienyl copper(I) ethylene. Another suitable copper precursor is the copper(I) beta-diketiminate whose formula is shown below:

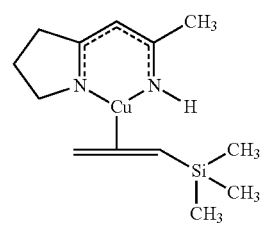

As noted above, electrochemical deposition can be used to fill the trenches and vias with copper by techniques known in the art. Electrochemical deposition may be able to provide pure copper without voids or seams in a cost-effective process.

In the foregoing description, the present invention has been described mainly with respect to Mn metal. However, the present invention encompasses other metals, such as cobalt, vanadium and chromium metals as well. Accordingly, these metals can be interchanged with manganese for the descriptions provided herein. For example, the precursor described above can be a cobalt, chromium or vanadium amidinates having the structure, $[Co(AMD)_m]_n$, $[Cr(AMD)_m]_n$ or $[V(AMD)_m]_n$, where AMD is an amidinate and m=2 or 3 and n can range from 1 to 3.

EXAMPLES

Example 1

The compound that served as a precursor for the manganese is called bis(N,N'-diisopropylpropionamidinato)manganese(II), whose chemical formula is shown below.

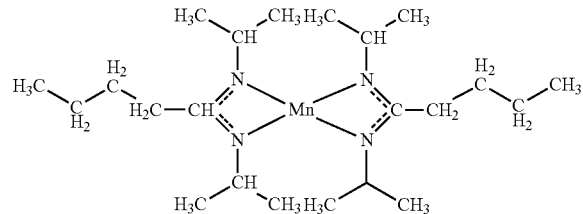

This compound was synthesized by the following method. All reactions and manipulations were conducted under a pure dinitrogen atmosphere using either an inert atmosphere box or standard Schlenk techniques. All glassware was stored in an oven at 150° C. for over 12 h before carrying reactions. Diethyl ether was purified using an Innovative Technology solvent purification system, and was freshly used from the purification without any storage. Butyllithium (1.6 M in hexanes), N,N'-diisopropylcarbodiimide, and manganese(II) chloride (anhydrous beads) were purchased from Aldrich and used as received. Volume reduction and evaporation steps were performed in vacuo.

Bis(N,N'-diisopropylpropionamidinato)manganese(II). At −30° C., a solution of butyllithium (1.6 M in hexanes, 100 mL, 160 mmol) was added dropwise to a well-stirred solution of N,N'-diisopropylcarbodiimide (20.2 g, 160 mmol) in 250 mL of diethyl ether. The pale-yellowish mixture was maintained at −30° C. for 4 h before being allowed to warm to ambient temperature. Manganese chloride (10.0 g, 79.5 mmol) was added as a solid to the solution, and the reaction mixture was stirred until all pinkish manganese chloride beads were reacted (ca. 48 h). The resulting cloudy orange mixture was filtered through a pad of Celite on a glass frit to yield a clear orange-brown solution. All volatiles were removed, leaving a yellow-brown solid that was vacuum distilled at 120° C. at 20 mTorr into a condenser and receiving flask heated to over 60° C., the melting point of the product. The pale yellowish liquid condensate solidified in the receiving flask as it cooled to room temperature, giving 27.4 g, 65 mmol, or 82% yield of pure product. Bis(N,N'-diisopropylpropionamidinato)manganese(II) is a pale yellow crystalline solid that immediately turns black when exposed to air.

For the CVD experiments, the liquid manganese precursor was evaporated at a temperature of 90° C. into a flow of highly purified nitrogen (concentrations of water and oxygen less than $10^{-9}$ of the $N_2$). The vapor pressure of the precursor is estimated to be around 0.1 mbar at this temperature.

The silica substrates were either thermally oxidized silicon or silica deposited by ALD or by plasma-enhanced CVD. The CVD was carried out in a hot-wall tube reactor (diameter 36 mm) within a tube furnace at temperatures between 200 and 400° C. and a total pressure of about 5 Torr. The flow rate of $N_2$ carrier gas was 60 sccm. The amount of manganese deposited was measured by Rutherford backscattering spectroscopy (RBS).

The $MnSi_xO_y$ formation was evaluated by cross-sectional high-resolution transmission electron microscopy (HRTEM). The effectiveness of the $MnSi_xO_y$ as a barrier to diffusion of Cu was tested in four ways: optical appearance, sheet resistance, Cu silicide formation and capacitance-voltage (CV) analysis of capacitors. For Cu diffusion tests, layers of $SiO_2$ 8 nm thick were grown on HF-etched silicon wafers by ALD at 215° C., followed by CVD Mn at 350° C. for 10 min, which deposited an amount of Mn metal equivalent to a Mn metal film 2.3 nm thick, which reacted with the silica surface to form a thicker $MnSi_xO_y$ layer. Control samples of $SiO_2$ omitted the CVD Mn treatment. Then Cu layers about 200 nm thick were deposited on top of the CVD $MnSi_xO_y$ or $SiO_2$ layers Anneals in a pure nitrogen atmosphere were carried out at temperatures of 400, 450 and 500° C. for one hour. For CV analysis, CVD Mn was deposited on 300 nm thermal $SiO_2$. Cu pads (500 μm diameter circle) were formed by thermal evaporation through a shadow mask.

Figure 11:
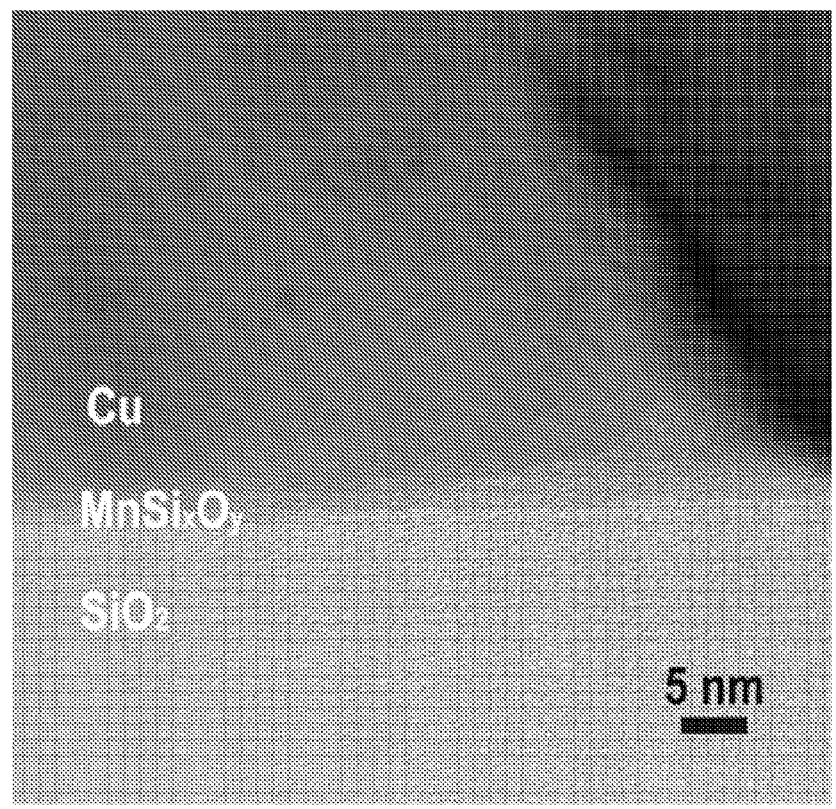
FIG. 11 is a cross-sectional high-resolution transmission micrograph of the result of CVD Mn on a $Cu/SiO_2/Si$ substrate.

Thin Mn layers (equivalent to a Mn metal layer 2.3 nm thick) deposited on $SiO_2$ did not have significant electrical conductivity, presumably because the Mn reacts with the insulator to form $MnSi_xO_y$ which has a high resistivity. Thus, the deposition of metal Mn is not proven by this result. To confirm that Mn metal was initially deposited, Mn was deposited on Cu 50 nm thick that had been evaporated onto $SiO_2$/Si substrates. The resulting structure was examined by cross-sectional HRTEM. FIG. 11 shows that the CVD Mn metal diffused through the Cu layer and reacted with the $SiO_2$ to form an amorphous $MnSi_xO_y$ layer about 2-5 nm thick between the Cu and the $SiO_2$. The $MnSi_xO_y$ layer is thicker near grain boundaries in the Cu, along which Mn diffusion is faster. This result is clear evidence of Mn metal deposition.

These layers show strong adhesion after Mn deposition. No material was removed after a tape adhesion test. The adhesion of these layers was measured more quantitatively by a 4-point bend test to be greater than 5 J m$^{-2}$. This value is high enough to survive CMP and later mechanical stresses in microelectronic devices. In control experiments, Cu deposited on $SiO_2$ without the subsequent Mn deposition was easily pulled off by tape because of its poor adhesion.

The effectiveness of $MnSi_xO_y$ as a copper barrier was evaluated using a sample structure PVD Cu (200 nm)/CVD Mn (2.3 nm)/ALD $SiO_2$ (8 nm)/Si. A $MnSi_xO_y$ layer was formed between the Cu and ALD $SiO_2$ layers. The shiny Cu color and sheet resistances of these samples were unchanged by anneals in nitrogen at 400 or 450° C. After a 500° C. anneal, the control sample without Mn turned black and its sheet resistance increased by a factor of 200 because of massive diffusion of the Cu through the thin ALD $SiO_2$ into the silicon. The CVD Mn sample, by contrast, retained its shiny Cu color and showed only a slight increase in resistance even at 500° C.

Figure 12:
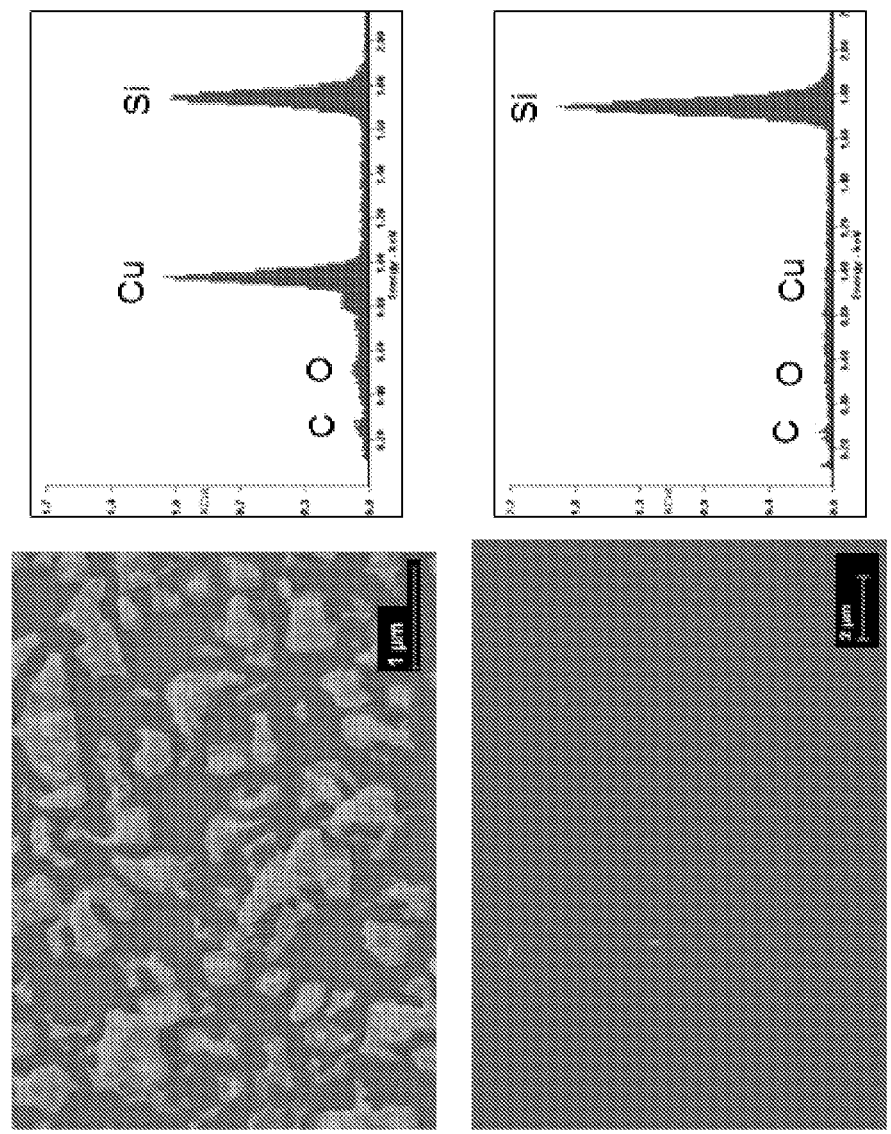
FIG. 12 is a scanning electron micrograph of (a) $Cu/SiO_2/Si$ and (b) $Cu/MnSi_xO_y/Si$ after annealing at 500° C. and etching off the Cu, along with elemental analyses of the surfaces.

To analyze for Cu diffusion, the remaining Cu layers were dissolved in nitric acid, and then the manganese silicate and silica were removed by dilute HF. The etched surfaces were then analyzed by an energy-dispersive X-ray spectrometer (EDX) and scanning electron micrographs (SEM). FIG. 12 shows the SEM results after a 500° C. anneal for 1 hr. The few Cu-containing spots appear to be Cu silicide crystallites oriented by the crystal directions of the silicon. The control sample shows that the majority of its surface is covered by Cu silicide. The control sample showed a large Cu signal in EDX analysis that was stronger than the silicon signal, confirming that the thin ALD $SiO_2$ allowed diffusion of Cu. The CVD Mn-treated samples did not show Cu by large-area EDAX. A few small areas of the SEM image did show some Cu by EDAX, indicating some localized breakdown of the $MnSi_xO_y$ barrier at 500° C. These spots might arise from dust or other defects in the films, which were not processed in a clean-room environment.

Figure 13:
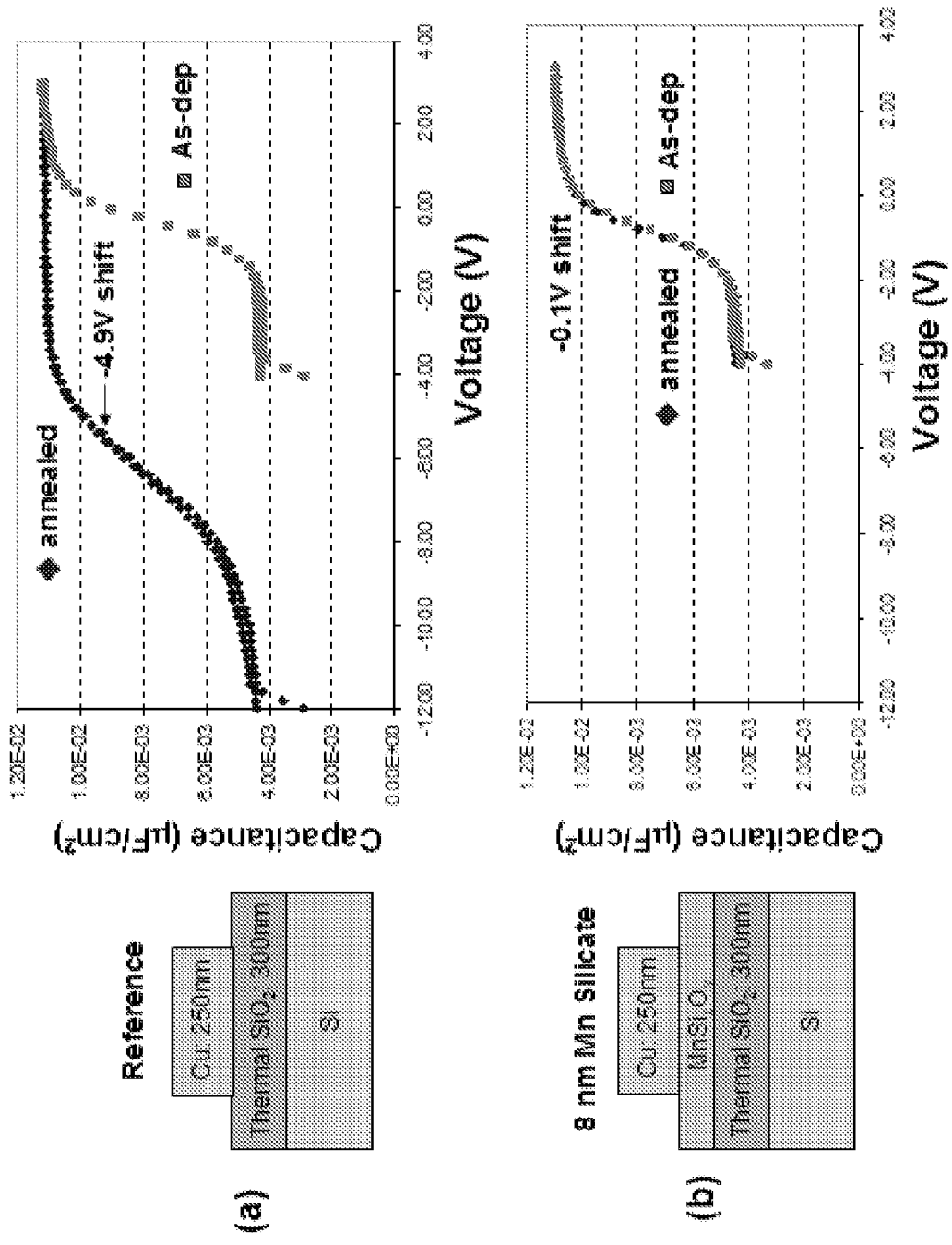
FIG. 13 shows capacitance-voltage curves for samples of (a) $Cu/SiO_2/Si$ and (b) $Cu/MnSi_xO_y/SiO_2/Si$ before and after annealing at 400° C.

An electrical test of barrier properties was carried out by patterning the Cu into capacitor electrodes. CV curves for samples annealed at 450° C. for 1 hr are shown in FIG. 13. The large shift (−4.9 V) to negative voltages in the control sample is caused by positive Cu ions diffusing into the silica insulator. In contrast, the silica protected by $MnSi_xO_y$ shows only a very small shift (−0.1 V). This electrical test is more sensitive to diffusion of small amounts of Cu than the other tests. These CV curves also demonstrate that the capacitance of the $SiO_2$ is not changed significantly by the CVD Mn treatment.

Figure 14:
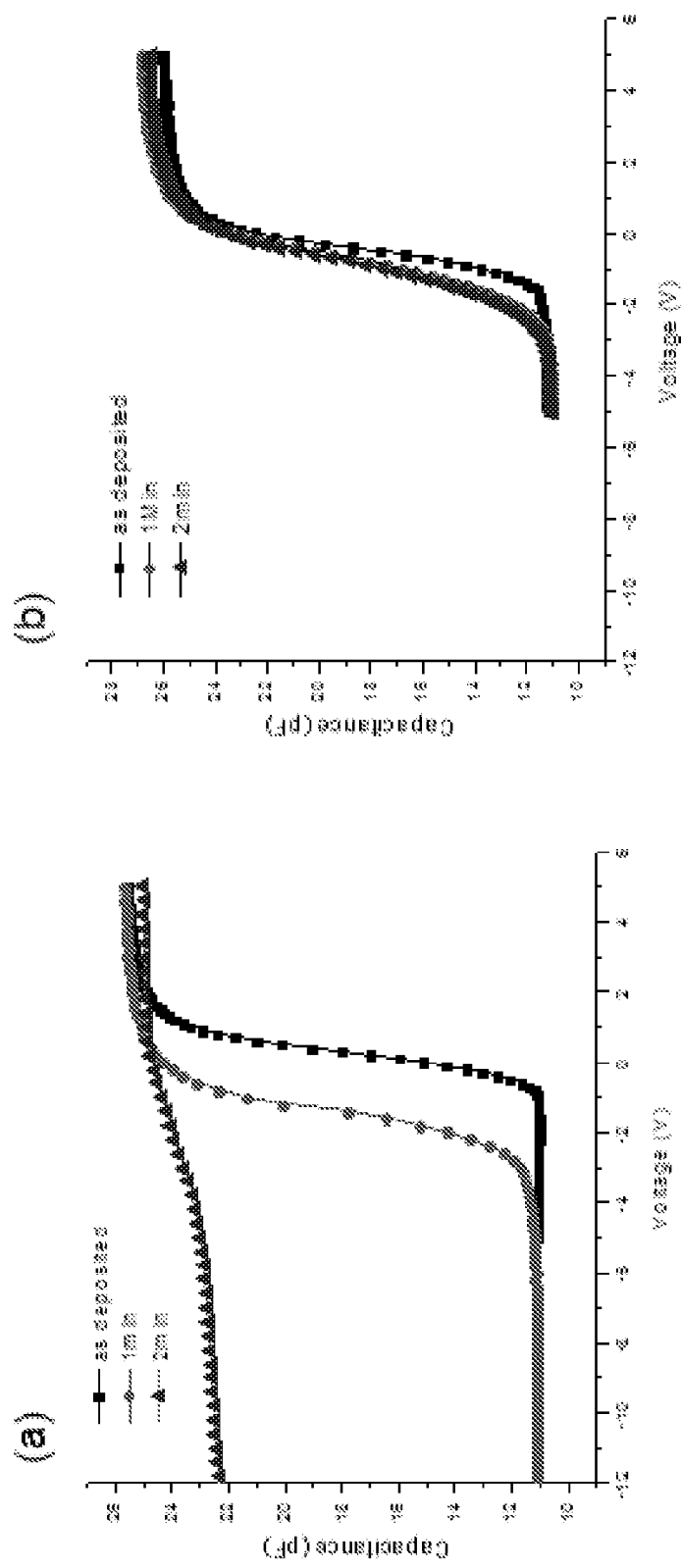
FIG. 14 shows capacitance-voltage curves for samples of (a) $Cu/SiO_2/Si$ and (b) $Cu/MnSi_xO_y/SiO_2/Si$ before and after annealing at 250° C. under a 1 MV/cm electric field.

Anneals of similar capacitors were also conducted under an applied voltage of 1 MV/cm at 250° C. Bias temperature stress (BTS) test is more sensitive method for Cu diffusion into $SiO_2$. The control sample lost the capacitance behavior after just 2 minutes in the BTS condition (FIG. 14(a)), implying that a large amount of Cu diffused into the Si, so that the Si would not work as a semiconductor. However, the CVD Mn treated sample had no significant change in its CV curve (FIG. 14(b)). The results of this BTS test confirm the good Cu barrier properties of the $MnSi_xO_y$ layers.

$MnSi_xO_y$ layers were also found to be good barriers to oxygen and water, which can corrode copper layers. To test how well the metal silicate layers protected copper, commercial low-k porous insulator layers from Applied Materials was coated with manganese as described above, followed by CVD copper. The top surface of the copper was protected with 20 nm of ALD silica by the process described in Science, volume 298, pages 402-406 (2002). The sample was cut into pieces to expose the edges of the low-k insulator so that oxygen or water vapor could diffuse into the low-k layer. After exposure to dry air at 300° C. for 24 hours, the sample maintained its shiny copper color. A control sample without the CVD manganese treatment was corroded to dark copper oxide by the same exposure. This test shows that the manganese silicate layer is a good barriers to oxygen. Similar tests in a humid atmosphere (85% humidity at 85° C. for 24 hours) showed that the manganese silicate layer is a good barrier to water vapor.

The formation of the $MnSi_xO_y$ layer increased the adhesion of the $Cu/SiO_2$ interface, which failed the tape adhesion test prior to the CVD of Mn, but passed after the CVD of Mn. Adhesion strength was measured by 4-point bend tests. The samples were prepared by CVD of Mn onto thermal $SiO_2$ on silicon wafers. Then CVD at 200° C. was used to form Cu by the reaction of vapors of copper N,N'-di-sec-butylacetamidinate and hydrogen ($H_2$). The adhesion energy was found to be 10.1±1 J m$^{-2}$. Generally, 5 J m$^{-2}$ is considered to be a minimum threshold requirement for making durable interconnections.

Figure 15:
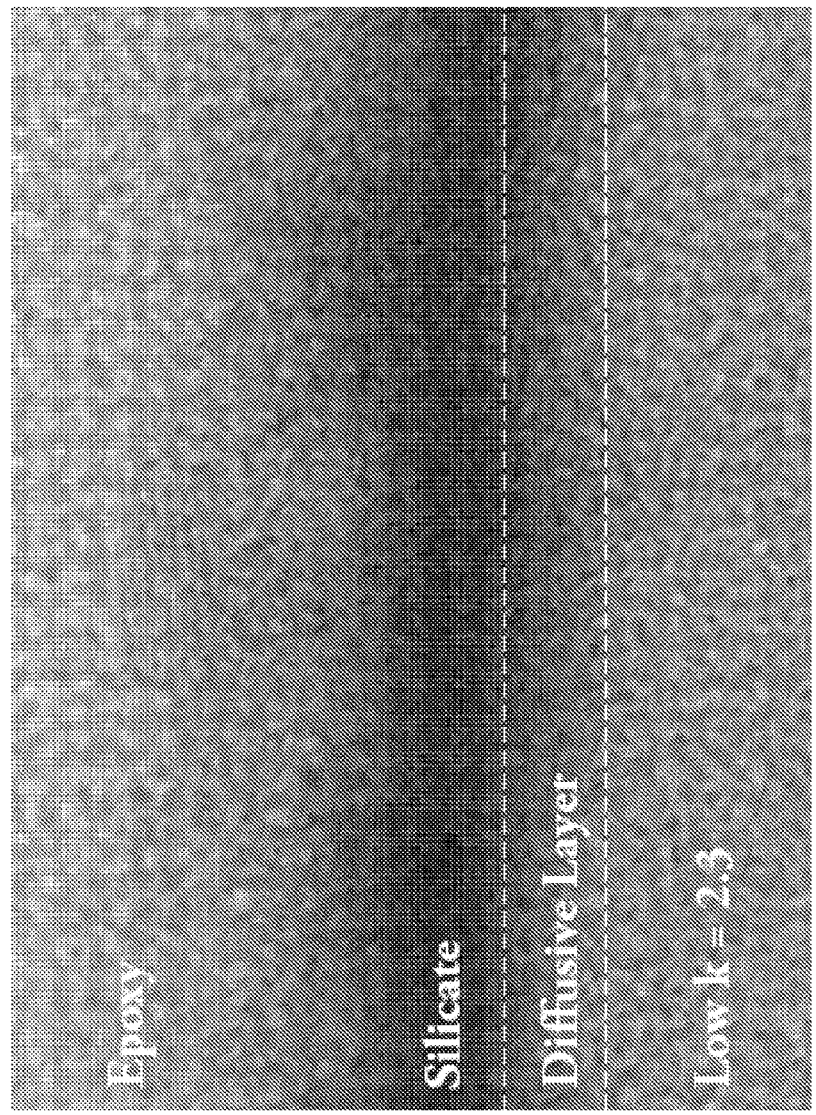
FIG. 15 shows a cross-section of a $MnSi_xO_y$ layer formed by CVD on a low-k insulator.

A cross-sectional transmission electron microscope (TEM) was used to make an image (FIG. 15) of a $MnSi_xO_y$ layer in the surface of a low-k insulator. This image shows the $MnSi_xO_y$ layer as a dark, featureless band, indicating that this layer is an amorphous glass. Conformality of the CVD Mn and CuON depositions in holes with aspect ratios up to 40:1 was confirmed by cross-sectional SEM and TEM studies.

Example 2

Example 1 is repeated with manganese cyclopentadienyl tricarbonyl, $MnCp(CO)_3$, in place of bis(bis(N,N'-diisopropyl-pentylamidinato)manganese(II). Similar results are obtained.

Example 3

Example 1 is repeated with chromium in place of manganese. Similar results are obtained.

Example 4

Example 1 is repeated with vanadium in place of manganese. Similar results are obtained.

Example 5

Improved adhesion between Mn-diffused Cu and a SiCN insulating film was obtained. Quantitative 4-point bend tests of the adhesion energy between Mn-diffused Cu and SiCN layers were carried out. 50 nm of copper was evaporated onto SiCN layers (BLoK™, Applied Materials). The Cu showed very poor adhesion, with adhesion energy less than 3 J m$^{-2}$. Next, similar Cu/SiCN layers were treated by CVD Mn at 350° C. for 10 minutes. This process increased the sheet resistance from 0.5 ohms/square to 1 ohm per square because of the manganese impurity in the copper. Then the structure was annealed for 1 hour at 400° C. in a nitrogen atmosphere. The sheet resistance then returned to slightly less than 0.5 ohms per square because the manganese diffused to the surfaces or the interface. The out-diffusion of the manganese from the Cu film was confirmed by SIMS analysis. After the heat treatment, the adhesion energy was remarkably increased to greater than 12 J m$^{-2}$, because manganese diffused to the interface, and made an interface or reaction layer. The adhesion energy was greater than the 10.1±1 J m$^{-2}$ obtained in Example 1.

Example 6

Even greater adhesion between Mn-diffused Cu and $Si_3N_4$ layers were observed. 20 nm of Cu was deposited by CVD as in Example 1 on a silicon wafer that had been previously coated with $Si_3N_4$ by plasma-activated CVD. Then 2.3 nm of Mn was deposited by the CVD process described in Example 1. Next another 20 nm of Cu was deposited by CVD, followed by 30 nm of $Si_3N_4$ by plasma-activated CVD (PECVD). The adhesion of these layers was so strong that they could not be separated during the 4-point bend tests. Instead, the high-strength epoxy failed at debonding energy densities over 80 J m$^{-2}$. Accordingly, at least an 8-fold increase in adhesion was observed using $Si_3N_4$ layers rather than the silica layer of Example 1.

Control samples made without the CVD Mn step failed at much lower debonding energy densities of about 7 J m$^{-2}$.

These results show that the bonding of Cu to a capping layer of $Si_3N_4$ can be greatly strengthened by the addition of Mn to the Cu layer by CVD. The much stronger bonding of the Mn-doped Cu to the capping layer can suppress electromigration along the tops of the capped line. Thus this capping process leads to a much greater lifetime of the interconnect lines before they fail by electromigration. The interfacial bonding layer comprising Mn, Si and N bonds copper metal to $Si_3N_4$ more strongly than an interfacial layer that includes oxygen.

Example 7

In addition, the Mn capping process is able to maintain the insulation between Cu lines. In order to demonstrate this effect, comb test structures were prepared with long (~4 cm) parallel Cu interconnects separated by $SiO_2$-based insulating lines 70 nm wide. The upper surfaces were prepared by chemical-mechanical polishing to be substantially flat. The leakage current between the lines was less than $10^{-12}$ amperes when measured at 2 volts. After CVD of Mn as in Example 1 for 5 minutes and PECVD of 20 nm $Si_3N_4$, the leakage current remained at this low base-line level. The resistance along the length of the lines decreased slightly from its initial value, possibly because of growth in the size of the copper grains during the CVD processes.

Example 8

Substrates of several commercial insulating layers on silicon were loaded into a CVD reactor, along with thin (20 nm) copper on oxidized silicon. These insulating samples included thermally-grown silicon dioxide, plasma-deposited silicon dioxide and non-porous low-k silicon carbide oxide (SiCOH) insulators with dielectric constants of 2.7 or 2.5, as well as porous low-k SiCOH insulators with dielectric constants of 2.4 or 2.2. Another substrate was patterned with areas of copper separated by areas of non-porous SiCOH (k=2.5). All these samples had received a chemical mechanical polish prior to the vapor treatments. After the substrates were loaded into the reactor they were flushed with purified nitrogen while they were heated to 250° C. Then copper oxide on the copper surfaces was reduced in purified hydrogen gas at 1 Torr for 1 hour at 250° C. This treatment also removed adsorbed water from the insulators. Next the reactor was cooled down to room temperature. Then two self-assembled monolayer (SAM) vapor pretreatments were applied, as follows. The reactor was pumped down to the base pressure (about 20 mTorr), and then filled with vapor (about 14 Torr) from a room-temperature source of bis(N,N-dimethylamino) dimethylsilane, $(CH_3)_2Si(N(CH_3)_2)_2$ and then heated to 90° C. for ½ hour. Then the reactor was again pumped to base pressure, cooled to room temperature and refilled with the vapor (about 75 Torr) of (N,N-dimethylamino)trimethylsilane, $(CH_3)_3SiN(CH_3)_2$ and heated to 90° C. for ½ hour. The samples were then heated to the manganese deposition temperature of 300° C. The manganese precursor, bis(N,N'-diisopropylpentylamidinato)manganese(II), was evaporated from the liquid in a bubbler at a temperature of 90° C. into a 60 sccm flow of highly purified nitrogen (concentrations of water and oxygen less than $10^{-9}$ of the $N_2$). This vapor mixture was mixed with 60 sccm of purified hydrogen at a tee just prior to entering one end of a tubular reactor. The reactor tube has an inner diameter of 36 mm. A half cylinder of aluminum supported the substrates inside the reactor. The pressure in the reactor was maintained at 5 Torr by a pressure sensor controlling a butterfly valve between the reactor and the vacuum pump. After the temperature was stabilized, the CVD vapor mixture was passed through the reactor for 20 minutes. Then the reactor was cooled down to room temperature and the samples removed for analysis.

Figure 16:
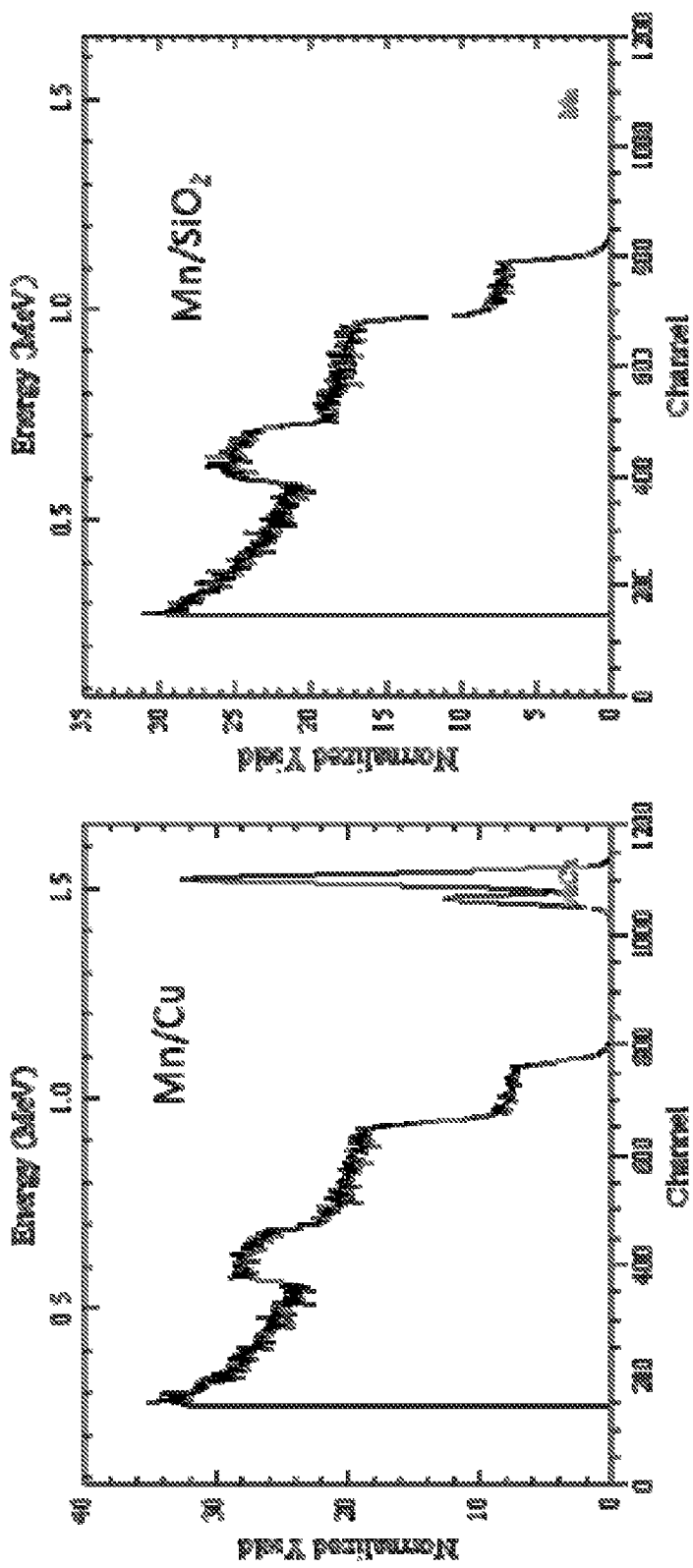
FIG. 16 shows the Rutherford Backscattering spectra (RBS) of a copper surface and a $SiO_2$ surface, each of which was exposed to the same CVD conditions, which deposited 8 nm of manganese only on the copper, while depositing no manganese on the $SiO_2$.
Figure 19:
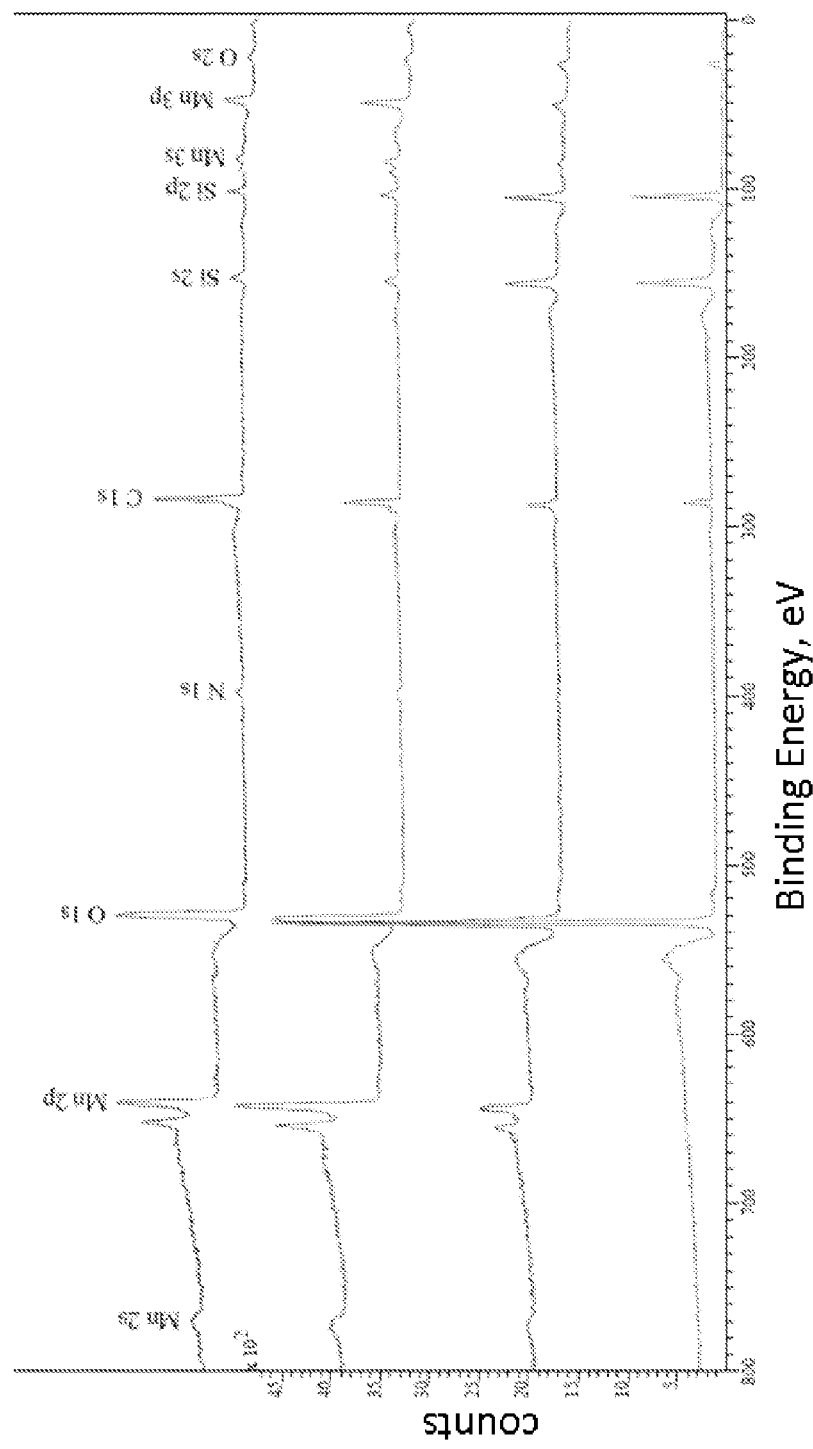
FIG. 19 shows X-ray Photoelectron Spectra of insulator surfaces subject to CVD manganese with the inventive process along with less selective processes.

Rutherford Backscattering Spectroscopy (RBS) was used to measure the amount of manganese deposited on the samples. The resulting data are shown in FIG. 16 for a copper substrate and for a low-k substrate (k=2.5). Analysis of these RBS data show that $6.6 \times 10^{16}$ manganese atoms per square centimeter were deposited on and into the copper substrate, an amount that would form a layer 8 nm thick if it had the density of bulk manganese metal. No manganese (detection limit $<5 \times 10^{13}$ atoms $cm^{-2}$) could be detected by RBS on either sample of silicon dioxide or on any of the low-k SiCOH insulators with k=2.4, 2.5 or 2.7. Thus this process has selectivity >1000:1 in favor of deposition on Cu versus deposition on these insulators. The manganese content of the patterned samples was also measured by Energy-Dispersive Analysis by X-rays (EDAX) in a Scanning Electron Microscope (SEM). 5.08 atomic % manganese was found in the copper areas, whereas no manganese (<0.01%) was detected on the insulating areas. According to the EDAX results, the selectivity is >500:1. X-ray Photoelectron Spectroscopy (XPS) also found manganese on copper, but no manganese on non-porous insulators, showing selectivity >100:1, as shown by the bottom curve in FIG. 19. Because RBS has the greatest sensitivity of these analytical methods, we conclude that the selectivity exceeds 1000:1.

On the porous SiCOH insulator with k=2.2, a low level of Mn ($1.2 \times 10^{14}$ atoms $cm^{-2}$) was detected on the insulator, corresponding to a selectivity about 500:1.

Figure 17:
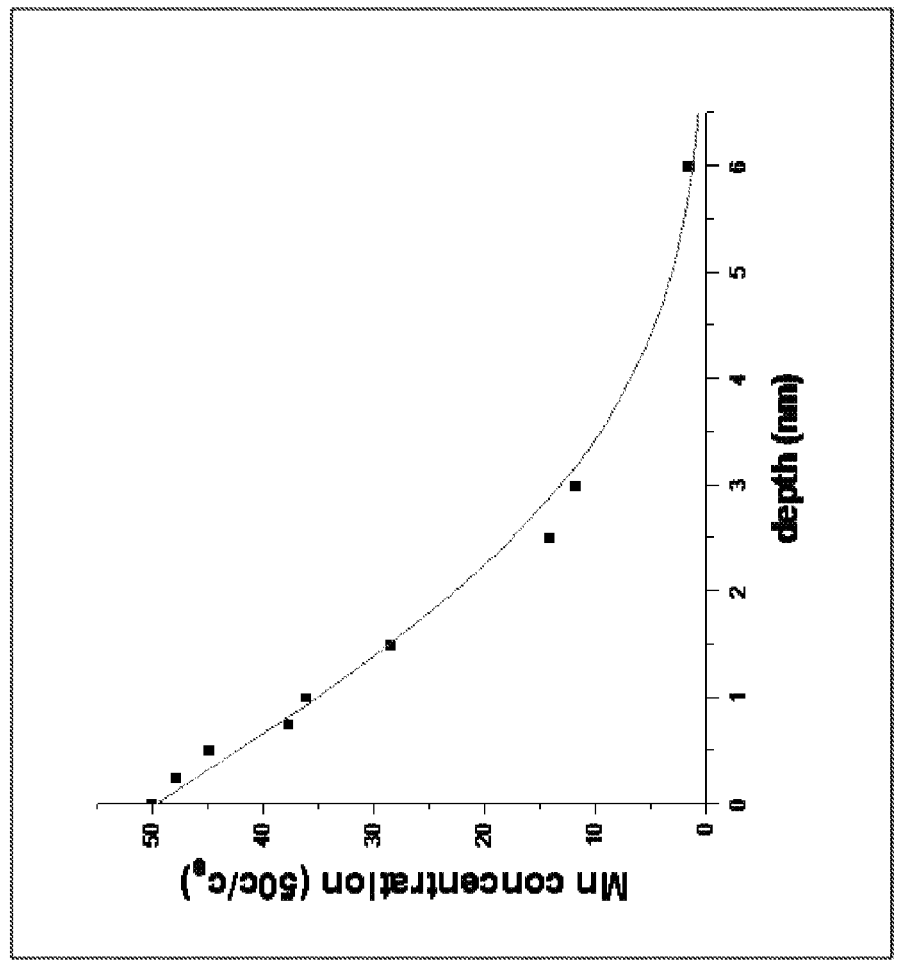
FIG. 17 shows the distribution of manganese near the surface of a copper layer that had been exposed to CVD of manganese.

The distribution of CVD manganese in a copper substrate, as determined by XPS analysis, is shown in FIG. 17. The points are the experimental values, and the line is a theoretical fit to the diffusion equation, assuming that the surface concentration of manganese remains constant during the CVD process, and that the substrate is cooled quickly after deposition. The diffusion constant determined from this fit is $3 \times 10^{-21}$ $m^2$ $s^{-1}$, a value that is about 30 times larger than the value previously reported for diffusion of Mn into single-crystal Cu at 300° C.

Example 9

Samples of the porous SiCOH insulators (k=2.2 or 2.4) were first subjected to pore-sealing by ALD $SiO_2$, as described in the patent application US2008/0032064, which is incorporated by reference herein in its entirety. Then they were treated with CVD manganese as described in Example 8. Analyses by RBS, EDAX and XPS showed that no manganese deposited on the sealed surfaces of the insulators.

Example 10

Figure 18:
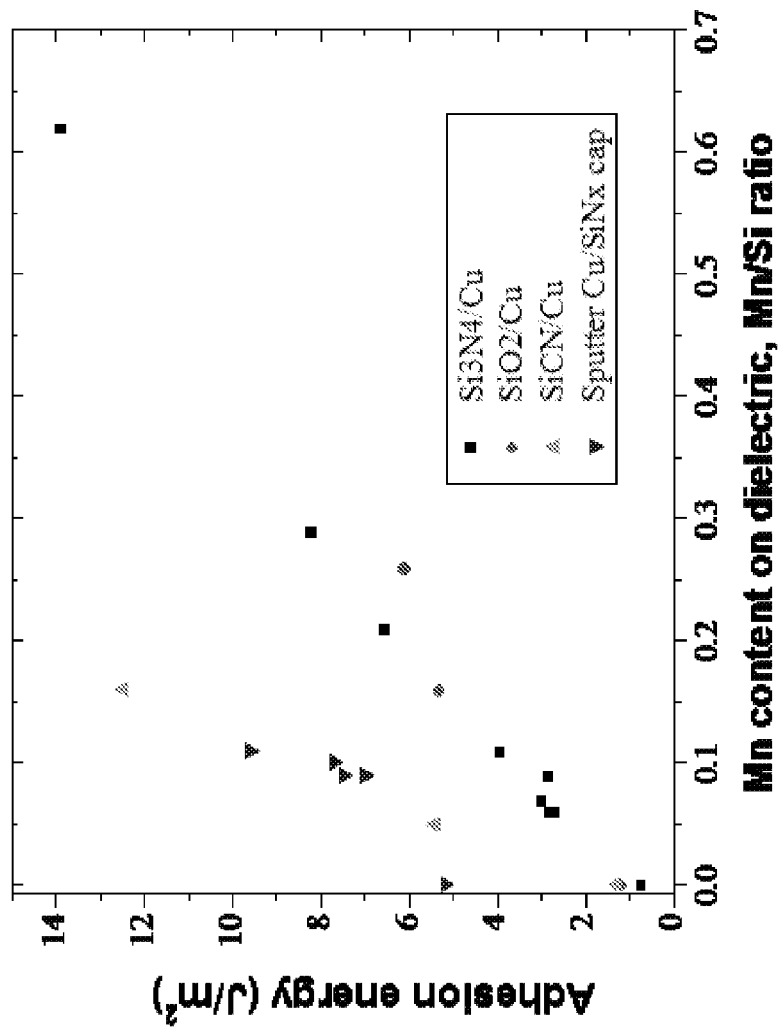
FIG. 18 shows a plot of the adhesion energy of a copper-manganese alloy to silicon-containing insulators as a function of the manganese to silicon ratio at the interface.

Additional tests were carried out to see how much manganese is required to increase the adhesion between copper and insulators onto which it is deposited. Insulating substrates of silicon dioxide, silicon nitride and silicon carbon nitride were used. First CVD was used to form a copper layer on the insulators as in Example 1, then CVD of manganese was carried out as in Example 1, and then a second CVD copper layer was deposited. These samples were taken through an air break into a chamber in which they received about 0.1 μm of sputtered aluminum, and then they were attached by high-strength epoxy to a piece of a second silicon wafer. Adhesion testing by the 4-point probe method gave the results shown in FIG. 18, in which the debonding energy is plotted against the ratio of manganese to silicon remaining on the fracture surface of the insulator, as determined by XPS. These results show that increasing amounts of manganese at the interface between the copper and an insulator greatly increases the adhesion strength between these materials.

Example 11

Additional tests were carried out to see how manganese strengthens the interface between a previously-deposited copper layer and silicon nitride subsequently deposited on top of the copper. First, titanium was sputtered onto a substrate of thermally oxidized silicon, followed by a sputtered copper layer. Following an air break, the oxidized copper surface was reduced by heating in purified hydrogen gas at 1 Torr for 1 hour at 250° C. Then CVD manganese was applied as described in Example 8. After another air break, the sample was treated by an ammonia plasma and then a plasma-CVD silicon nitride layer about 20 nm thick was deposited prior to sputtering 0.1 μm of aluminum. The fracture occurred at the interface between the silicon nitride and the copper onto which it was deposited. The fracture energies at this capping interface are also plotted in FIG. 18, which shows that it is bonded even more strongly than the copper-manganese deposited on top of substrates of silicon nitride as described in Example 10.

Comparative Example 1

A control experiment was carried out for comparison with Example 8. The steps in Example 8 were repeated, except that the reactions with bis(N,N-dimethylamino)dimethylsilane, $(CH_3)_2Si(N(CH_3)_2)_2$ and (N,N-dimethylamino)trimethylsilane, $(CH_3)_3SiN(CH_3)_2$ were omitted. About $3 \times 10^{15}$ manganese atoms per square centimeter were found on the surface of the insulator by RBS analysis. Although XPS does not count the atoms as quantitatively as RBS does, this amount of manganese was readily observed by XPS, as shown in the top curve in FIG. 19.

Comparative Example 2

A control experiment was carried out for comparison with Example 8. The steps in Example 8 were repeated, except that the reaction with bis(N,N-dimethylamino)dimethylsilane, $(CH_3)_2Si(N(CH_3)_2)_2$ was omitted and only the reaction with (N,N-dimethylamino)trimethylsilane, $(CH_3)_3SiN(CH_3)_2$, was carried out. Manganese was detected by XPS on the surface of the insulators, so complete selectivity was not obtained, as shown in the second curve from the top in FIG. 19.

Comparative Example 3

A control experiment was carried out for comparison with Example 8. The steps in Example 8 were repeated, except that the reaction with (N,N-dimethylamino)trimethylsilane, $(CH_3)_3SiN(CH_3)_2$ was omitted and only the reaction with bis(N,N-dimethylamino)dimethylsilane, $(CH_3)_2Si(N(CH_3)_2)_2$, was carried out. Manganese was detected by XPS on the surface of the insulators, so complete selectivity was not obtained, as shown in the third curve from the top in FIG. 19.

The conclusion from comparative examples 1, 2 and 3 is that pre-treatments with both bis(N,N-dimethylamino)dimethylsilane, $(CH_3)_2Si(N(CH_3)_2)_2$, and (N,N-dimethylamino) trimethylsilane, $(CH_3)_3SiN(CH_3)_2$ aids in minimizing deposition of manganese on insulators during the stabilization of copper surfaces by CVD manganese.

Comparative Example 4

A control experiment was carried out for comparison with Example 8. The steps in Example 8 were repeated, except that the flow of hydrogen, $H_2$, was replaced by a flow of nitrogen, $N_2$. XPS analysis showed the presence of manganese on the surfaces of insulators. The conclusion from comparative example 4 is that the presence of hydrogen during CVD aids in minimizing deposition of manganese on insulators during the stabilization of copper surfaces by CVD manganese.

Example 12

Cobalt metal was deposited selectively by CVD on copper surfaces, while little or no cobalt was deposited on suitably pretreated insulator surfaces. Substrates of copper and silica were first prepared by heating in purified hydrogen gas at 1 Torr for 1 hour at 250° C., and then exposed to the silane vapors as described in Example 8. Bis(N-tert-butyl-N'-ethyl-propionamidinato)cobalt(II) was prepared as described in the paper "Synthesis and characterization of volatile liquid cobalt amidinates", published in Dalton Transactions of the Royal Society of Chemistry, pages 2592-2597 in 2008, which is incorporated by reference herein in its entirety. This liquid cobalt precursor was placed in a bubbler at 85° C., at which temperature it has a vapor pressure about 0.26 Torr. Its vapor was delivered to the CVD reactor by passing 60 sccm of high purity $N_2$ gas through the bubbler. The co-reactant gas, $H_2$, with a flow rate of 60 sccm, was mixed with the precursor vapor stream just prior to entering the CVD reactor. The substrates were held at a temperature of 200° C. Deposition for 20 minutes was sufficient to cover the copper surface completely with cobalt. The evidence for this coverage is that XPS showed only signals for cobalt, with no signals characteristic of copper. On the silica surface, no XPS signals for cobalt were detected, while the RBS analysis showed less than $10^{14}$ cobalt atoms per square centimeter.

Example 13

Plasma-enhanced silica layers on silicon were used as substrates for manganese deposition under conditions described in Example 1 to form $MnSi_xO_y$ layers. Then CVD manganese nitride was deposited by reacting the same manganese precursor with ammonia at a partial pressure of 2 Torr and hydrogen at a partial pressure of 1 Torr, and a substrate temperature of 130° C. for 5 minutes, resulting in a coating with composition $Mn_4N$ about 2.5 nm thick. The root-mean-square surface roughness was measured by atomic force microscopy to be 0.3 nm, which is barely larger than that of the substrate, 0.2 nm. This result shows that the manganese nitride remains smooth and does not agglomerate at this low deposition temperature.

Example 14

Manganese nitride was deposited as in Example 13. The manganese nitride layer was then reduced by hydrogen plasma at a substrate temperature just above room temperature (heated to about 50° C. by recombination of hydrogen atoms on the surface) to produce a smooth, non-agglomerated layer of manganese metal.

Example 15

As another example of CVD of manganese nitride, the manganese precursor was evaporated from the liquid in a bubbler at a temperature of 90° C. into a 60 sccm flow of highly purified nitrogen (concentrations of water and oxygen less than $10^{-9}$ of $N_2$). This vapor mixture was mixed with 60 sccm of highly purified nitrogen and 60 sccm of purified ammonia (NH$_3$) at a tee just before entering one end of a tubular reactor. The reactor tube had an inner diameter of 36 mm. A half-cylinder of aluminum supported the substrates inside the isothermal reactor. The reactor temperature was controlled at 130° C. and the total pressure in the reactor was maintained at 5 Torr by a pressure sensor controlling a butterfly valve between the reactor and the vacuum pump. Under these conditions, about 2.5 nm of manganese nitride film was deposited in 5 minutes.

Figure 20:
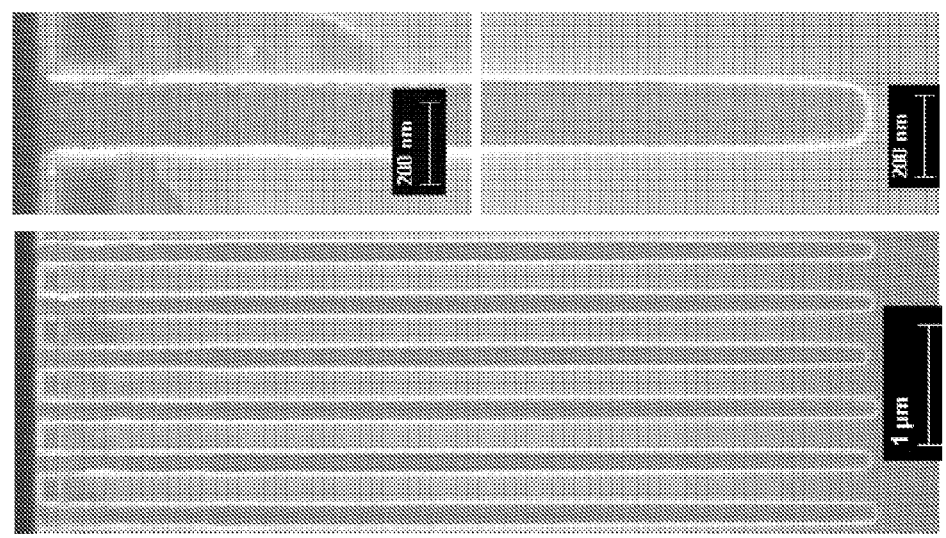
FIG. 20 is a scanning electron micrograph (SEM) of narrow holes lined with $MnN_x$ in accordance with certain embodiments.

Substrates having holes with aspect ratio (ratio of length to diameter) of 52:1 were coated in this way with MnN$_x$, x~0.25. FIG. 20 shows a SEM of a cross section through some of these holes. The bright line outlining the holes comes from the MnN$_x$ film, showing that the material was deposited uniformly and conformally over the inside surfaces of these holes. X-ray diffraction showed that the material has the cubic structure known for Mn$_4$N. Atomic force microscopy (AFM) showed that Mn$_4$N films are fairly smooth, with a root-mean-square roughness equal to 7% of their thickness.

Example 16

Mn$_4$N was deposited as in Example 15. The Mn$_4$N film was kept in the reactor in a flow of pure nitrogen while it was cooled to about 50° C., in order to protect its surface from oxidation. Ethyl iodide vapor (CH$_3$CH$_2$I, boiling point 72° C.) was then used as an iodine source to adsorb iodine atoms onto the fresh surface of the manganese nitride film. The ethyl iodide was contained in a bubbler at room temperature and its vapor was fed directly into the reactor at a partial pressure of 0.05 Torr for 30 seconds along with a nitrogen carrier gas at a flow rate of 100 sccm and a total pressure of 0.5 Torr. CVD copper was then deposited in the same reactor using copper precursor evaporated from the liquid in a bubbler at a temperature of 130° C. into a 40 sccm flow of highly purified nitrogen. Hydrogen (40 sccm) was mixed with the copper precursor vapor just before entering the reactor held at a substrate temperature of 180° C. and a total pressure of 5 Torr. Under these conditions, about 65 nm of copper was deposited in 40 minutes.

Figure 21:
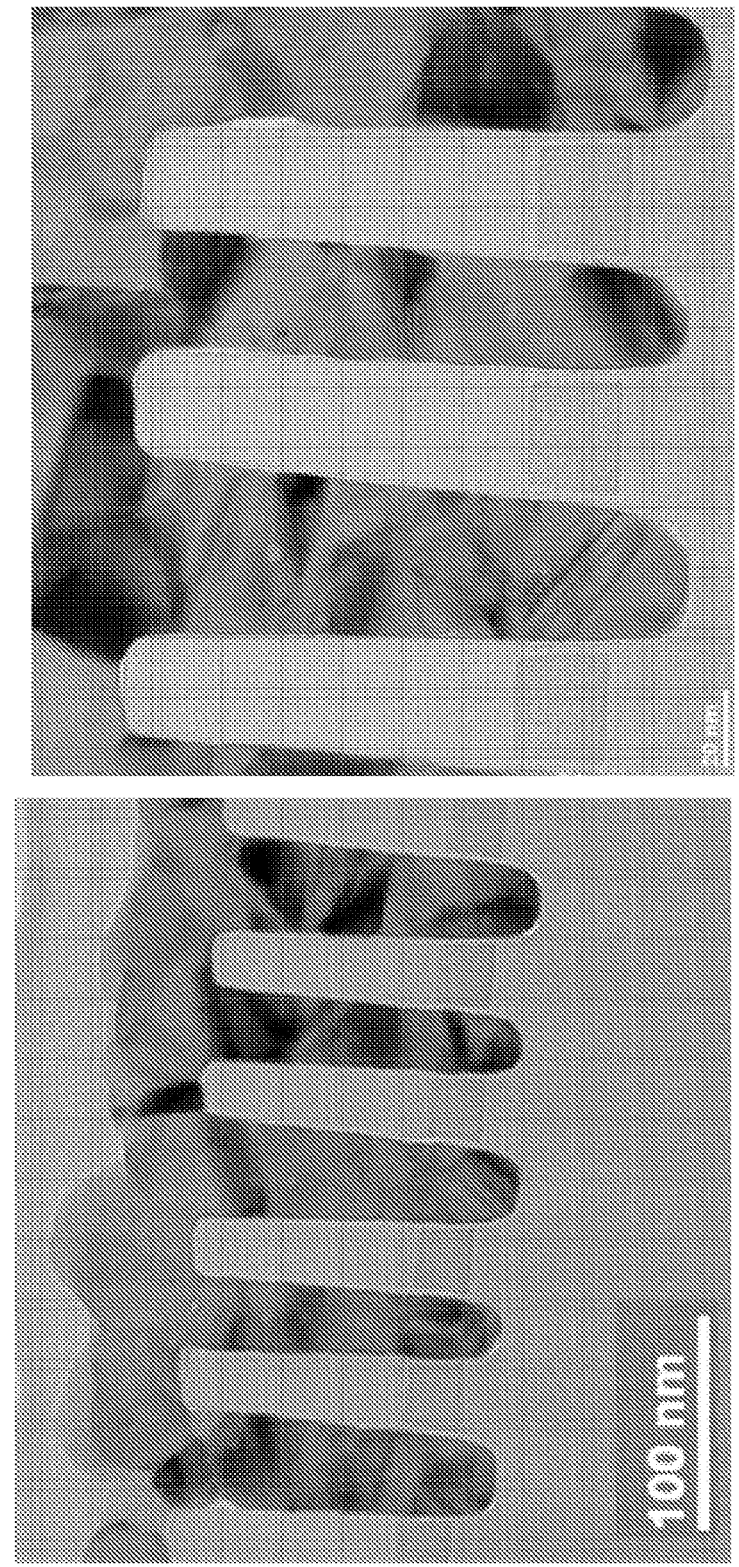
FIG. 21 is a transmission electron micrograph (TEM) of narrow trenches lined with $MnN_x$ and filled with Cu in accordance with certain embodiments.
Figure 22:
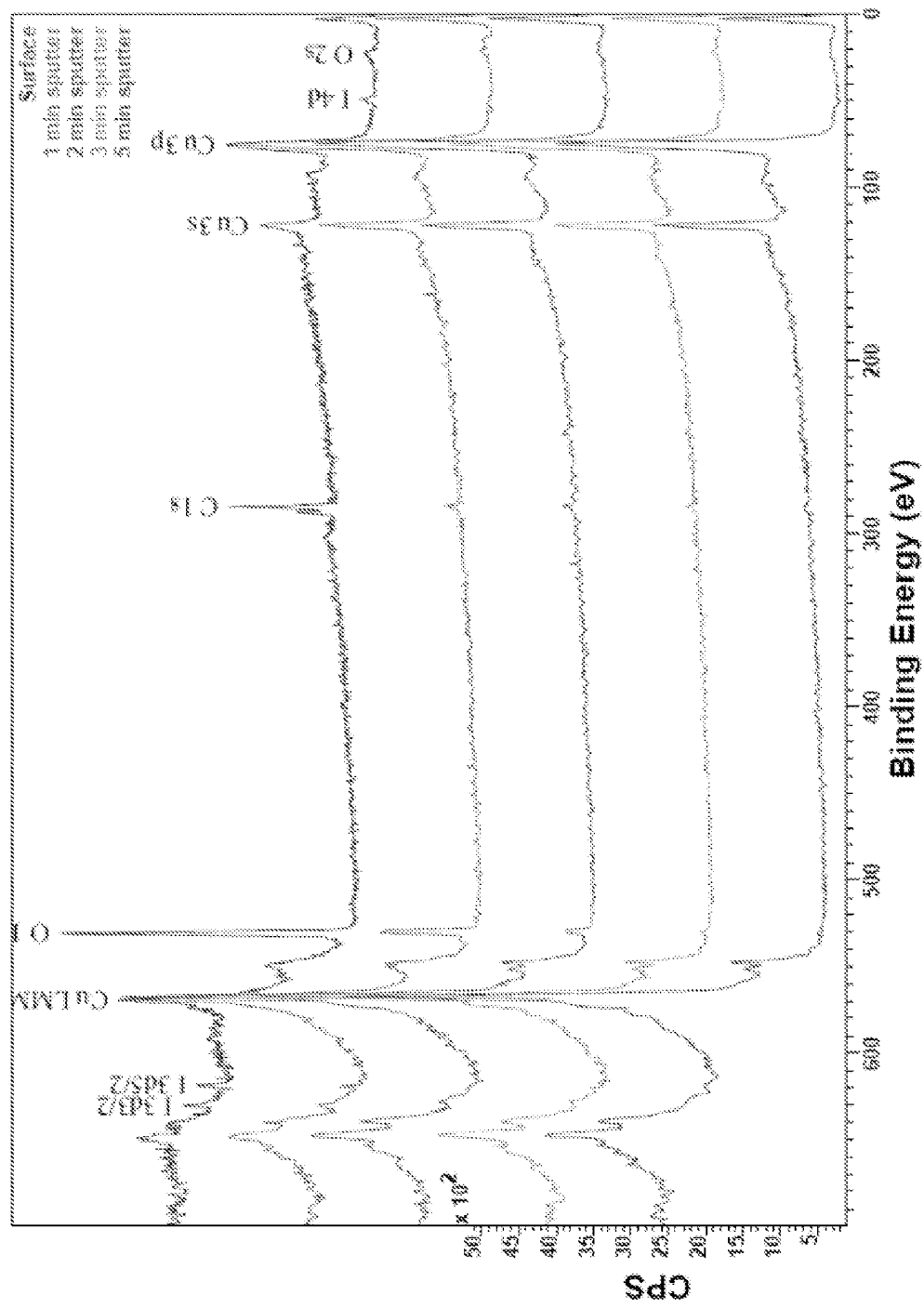
FIG. 22 shows X-ray photoelectron spectra (XPS) showing that iodine remains on the surface of the copper throughout the deposition of copper.
Figure 23:
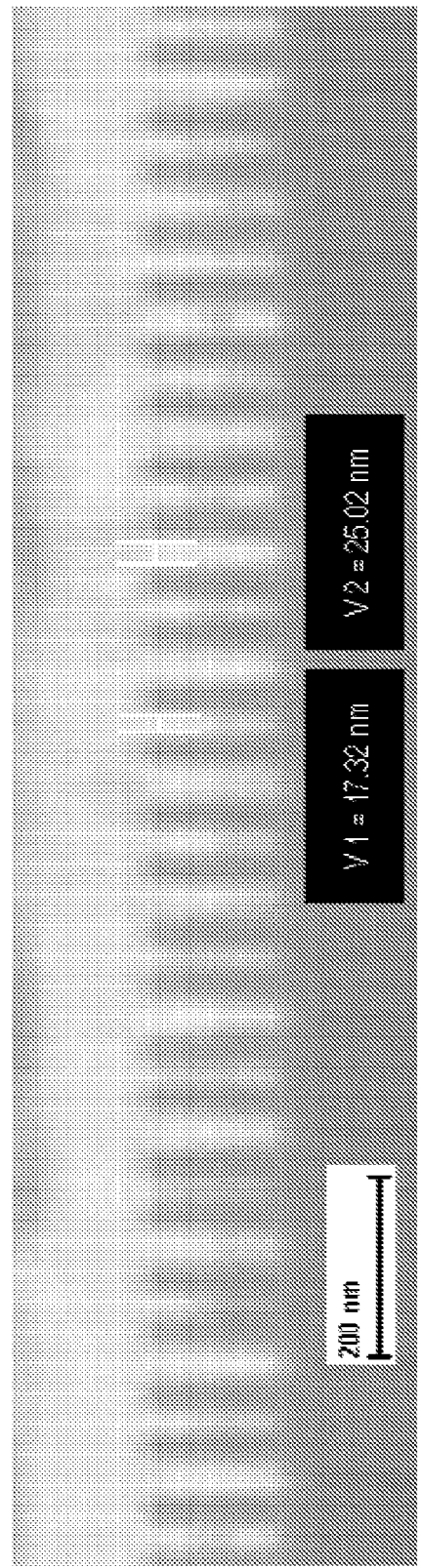
FIG. 23 is a scanning electron micrograph of narrow trenches lined with $MnN_x$ and filled with Cu in accordance with certain embodiments.
Figure 24:
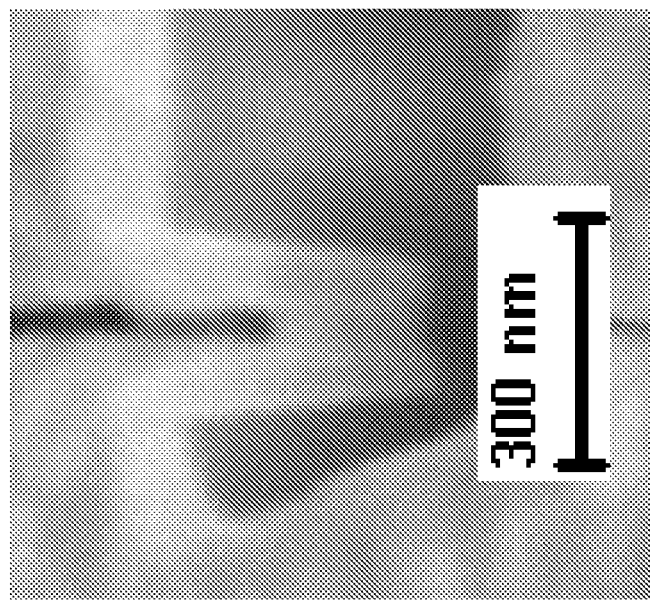
FIG. 24 shows a trench partly filled by iodine-catalyzed CVD of copper on an $MnN_x$ lined trench.

FIG. 21 shows that this process completely filled trenches less than 30 nm wide and over 150 nm deep with copper, with an aspect ratio over 5:1. No seams or voids were seen along the centerline of the copper, suggesting that iodine pre-adsorbed on the Mn$_4$N was released from the Mn$_4$N and then catalyzed the bottom-up filling of these trenches as a surfactant floating on the growing surface of the copper. FIG. 22 shows that after the deposition iodine is found only on the top surface of the copper by X-ray photoelectron spectroscopy (XPS). Signals of iodine disappear together with signals of oxygen and carbon from surface contamination as the film is sputtered from the top, and no impurities are detectable in the bulk of the copper film. These XPS data prove that the iodine was successfully released from the Mn$_4$N surface, and floated as a catalytic surfactant on the growing copper surface. Even narrower trenches, with widths as low as 17 nm, depths over 150 nm and aspect ratios of 9:1, were also filled successfully with Cu by this process, as shown by the SEM in FIG. 23. Conventionally, it had been believed that catalytic CVD of copper could not provide void-free filling of trenches if their aspect ratio was over 5:1. However, contrary to conventional wisdom, substantially void-free filling of trenches was achieved with CVD of copper catalyzed by iodine released from the surface of the MnN$_x$. Wider trenches were partially filled with copper by the same deposition conditions, as shown in FIG. 24. The fact that the copper grew faster from the bottom than from the sides of the trench shows that the iodine catalyst was released from the surface of the MnN$_x$ layer.

Another surprising observation from the micrographs in FIG. 21 is that large copper grains completely cross the width of the trenches, even without any post-deposition annealing. This "bamboo structure" is highly desirable, because it extends the lifetimes of copper lines before they fail by electromigration. Another factor that extends the electromigration lifetime is if the adhesion of the copper to the surrounding material is strong. Therefore we tested the adhesion of planar copper films grown on Mn$_4$N according to the process described in Example 16. Following the deposition, the structures were annealed at 350° C. for one hour in a pure nitrogen gas ambient. 4-point bend tests on these samples showed debonding energies greater than 6.5 Joules per square meter, which is a value high enough to survive further fabrication by chemical-mechanical polishing.

Figure 25:
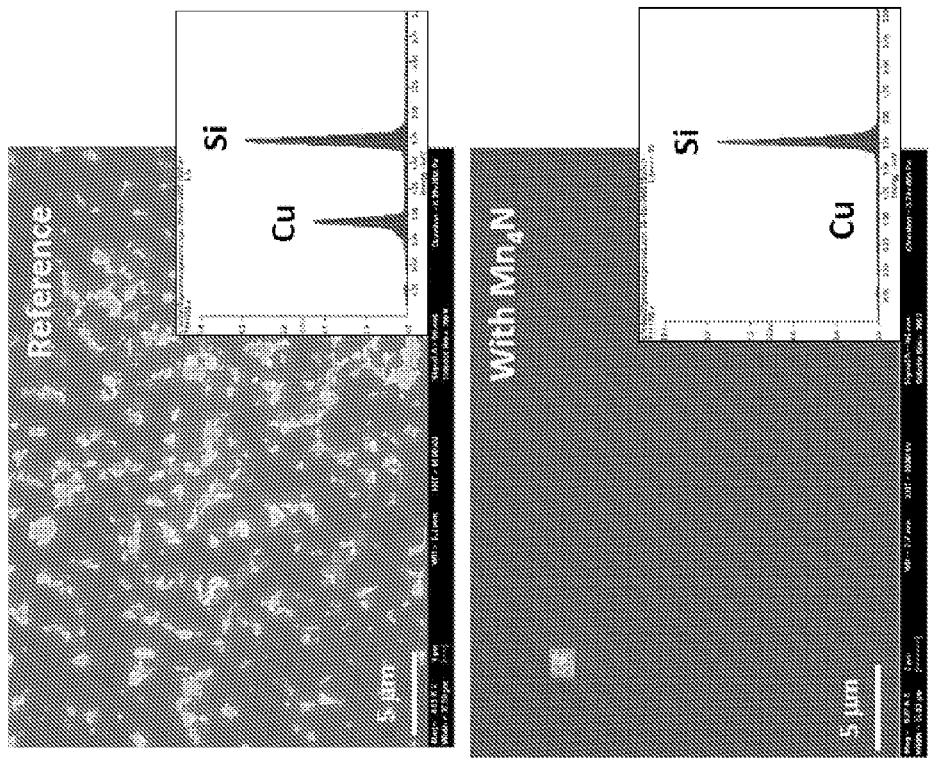
FIG. 25 shows SEM and energy-dispersive X-ray analysis (EDX) data showing that $MnN_x$ is a barrier to diffusion of copper.

The effectiveness of manganese nitride as a barrier to diffusion of copper was tested by looking for its reaction with silicon to form copper silicide. For this copper diffusion test, layers of SiO$_2$ 9 nm thick were grown on HF-etched silicon wafers by atomic layer deposition (ALD) at 250° C., followed by CVD manganese nitride at 130° C. for 5 min, which formed 2.5 nm of film, and a post-deposition anneal at 350° C. for 1 hour under nitrogen ambient. Control samples of SiO$_2$ omitted the CVD manganese nitride treatment. Copper layers about 200 nm thick were then deposited on top of the manganese nitride or SiO$_2$ layers. The samples were then annealed in a pure nitrogen atmosphere at 500° C. for 1 hour. To see if copper had diffused into the silicon substrate, the Cu layers were dissolved in nitric acid, and the manganese nitride and silica were removed by dilute HF. The etched surfaces were then analyzed by an energy-dispersive X-ray spectrometer (EDX) and SEM with the results shown in FIG. 25. The reference sample shows that the majority of its surface is covered by copper silicide crystallites, indicating copper has diffused through the thin silica layer. The manganese nitride-treated sample does not show any Cu by large-area EDX, showing that MnN$_x$ or its reaction product with SiO$_2$ forms an effective barrier against diffusion of copper.

Comparative Example 5

Example 16 was repeated, except that the CVD of MnN$_x$ was omitted. Thus ethyl iodide vapor was exposed to the bare SiO$_2$ surface, rather than to MnN$_x$. Much less copper was deposited than in Example 16, and what copper was present was in the form of agglomerated grains, rather than as a conformal film or a filling of narrow trenches. This comparative result shows that SiO$_2$ is unable to chemisorb iodine and then release it to serve as a catalytic surfactant, as compared to the MnN$_x$ as shown in Example 16.

Example 17

Example 16 was repeated, except that the first copper layer was grown only for 5 minutes. Then an additional step of iodine adsorption was applied to the fresh copper surface. Then additional CVD of Cu was carried out for 40 minutes. Similar results were found, with the difference that the total amount of copper deposited was 50% larger than in Example 16, presumably because of the additional amount of iodine catalyst that was supplied.

Example 18

Figure 26:
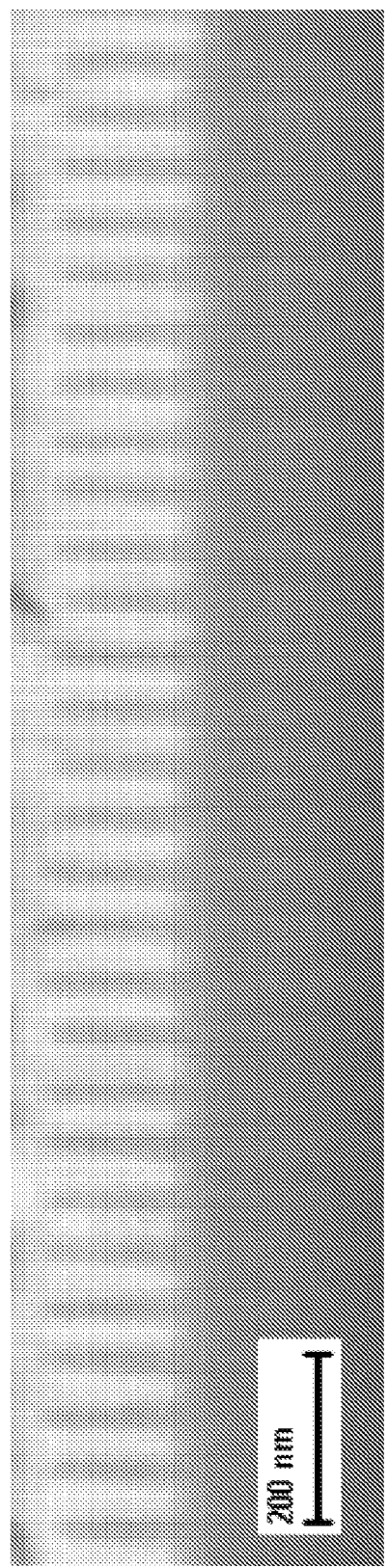
FIG. 26 is a SEM of narrow trenches lined with $MnN_x$ and filled with a Cu—Mn nanolaminate in accordance with certain embodiments.
Figure 27:
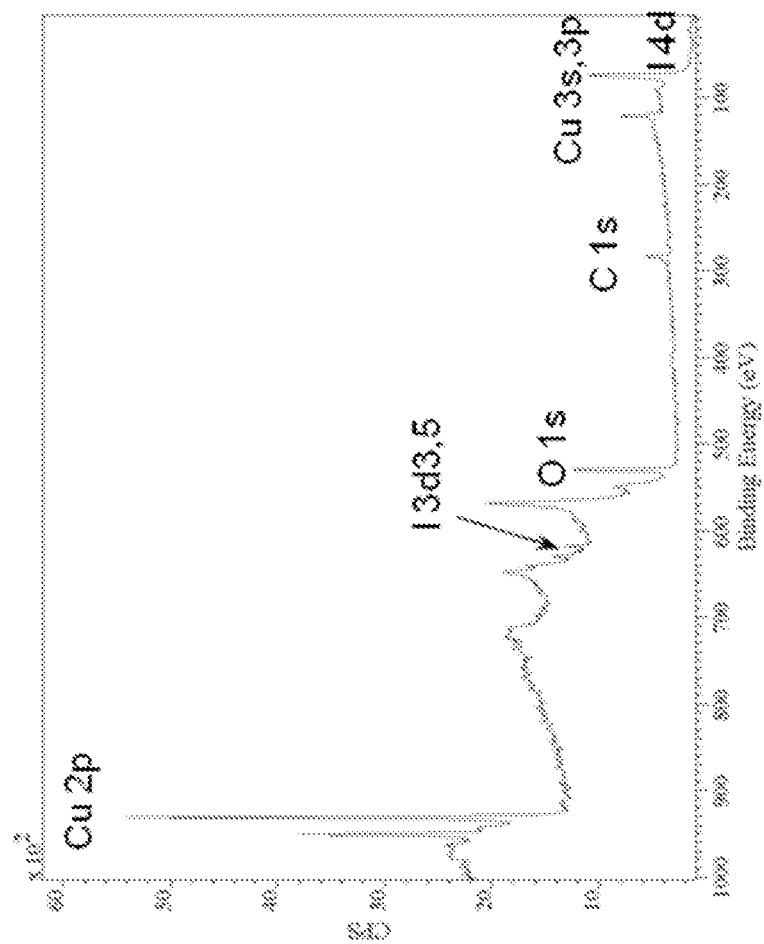
FIG. 27 shows that iodine remains on the surface during deposition of a copper-manganese nanolaminate.

Manganese nitride was first deposited at 130° C. for 5 minutes to form 2.5 nm of film. Ethyl iodide was then introduced into the chamber at 50° C. for 30 seconds at a pressure of 0.05 Torr. Copper was then deposited at 180° C. for 5 minutes to form a continuous layer, and ethyl iodide vapors were again exposed to the Cu surface at 50° C. for 30 seconds. Manganese and copper precursors were then alternatively carried into the chamber by 50 sccm of nitrogen and mixed with 50 sccm of hydrogen at a substrate temperature of 180° C. and a total pressure of 5 Torr. In one cycle, the manganese precursors were supplied for 3 minutes and the copper precursors were supplied for 5 minutes. This cycle was repeated until the trenches were completely filled with a copper-manganese nanolaminate. The Mn/Cu ratio was quantified by X-ray fluorescence (XRF) and was found to be approximately 0.5 atomic percent manganese. The Cu—Mn nanolaminate completely filled narrow trenches, as shown by the SEM in FIG. 26. The iodine catalyst was found on the top of the nanolaminate surface by XPS, as shown in FIG. 27.

After annealing, samples prepared according to Example 18 show stronger adhesion to insulator surfaces such as $SiO_2$, $Si_3N_4$ and low-k insulators. When the ratio of manganese to silicon exceeds about 0.5 at the interface between the Cu—Mn and the insulator, the debonding energy becomes larger than about 15 Joules per square meter. Such strong interfaces cannot be broken during the 4-point bend test. This very strong adhesion is expected to greatly increase the lifetime of copper interconnects before they fail by electromigration. The amount of manganese in the copper to achieve this interfacial concentration will depend on the size and shape of the copper interconnect. Concentration of manganese in the copper in the range from 0.1% to 4% or more preferably between 0.2% and 2% may be sufficient to obtain the strong adhesion to insulator surfaces.

Example 19

Figure 28:
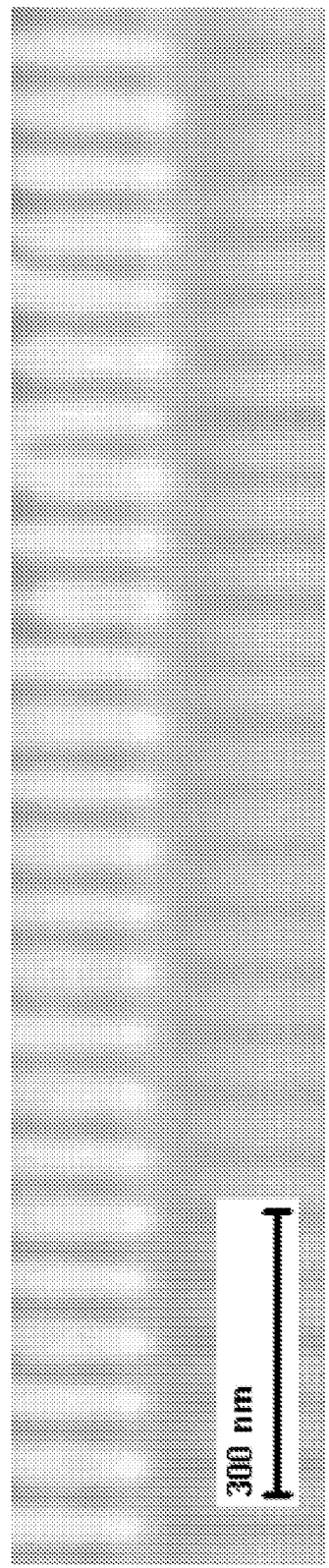
FIG. 28 is a SEM of narrow trenches lined with $MnN_x$ and filled with a Cu—Mn alloy in accordance with certain embodiments.
Figure 29:
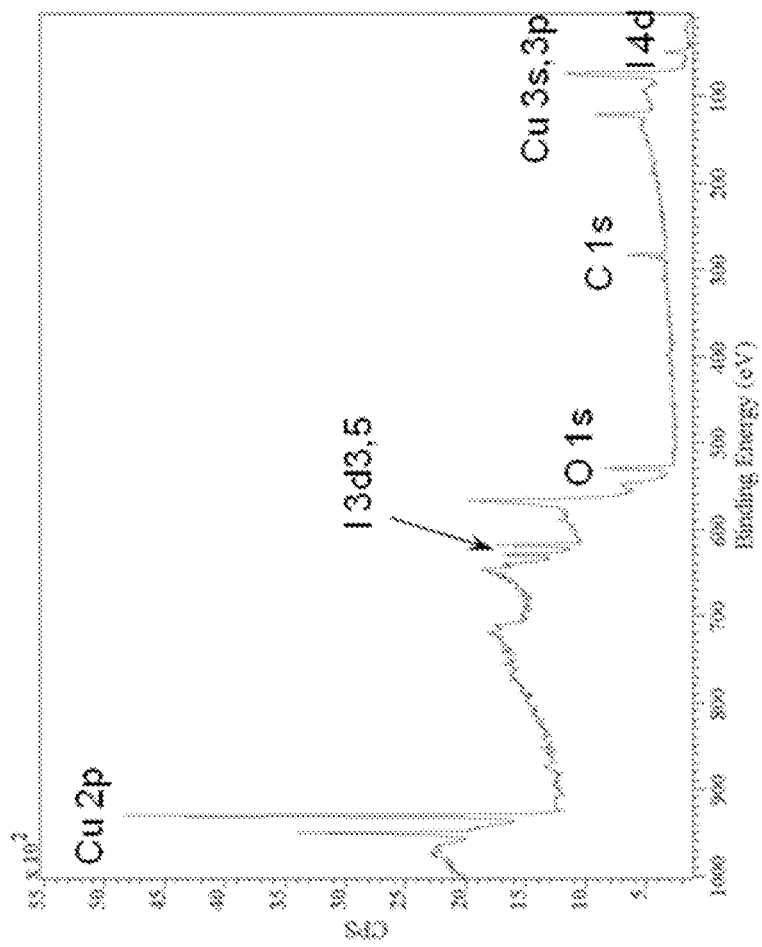
FIG. 29 shows that iodine remains on the surface during deposition of a copper-manganese alloy.

Example 18 was repeated up through the second iodine exposure. Then the Mn precursor vapors were carried by 60 sccm of nitrogen and simultaneously the Cu precursor vapors were carried by 40 sccm of nitrogen. These precursor vapor flows were mixed together with 100 sccm of hydrogen at a temperature of 120° C. and a pressure of 5 Torr. This gas mixture flowed into the deposition zone heated to 180° C. for 45 minutes. The trenches were completely filled with a copper-manganese alloy, as shown in FIG. 28, and the tops of the trenches were covered by about 180 nm of Cu—Mn alloy. The Mn/Cu ratio in the alloy was quantified by XRF and was found to be approximately 0.4 atomic percent manganese and 99.6 copper. The iodine catalyst was found on the top surface of the copper-manganese alloy by XPS, as shown in FIG. 29.

It should be noted that the proposed explanation regarding the existence of manganese nitride providing sufficient balance of chemisorption and subsequent release of the iodine fails to explain the successful results of Examples 18 and 19, in which most of the manganese has no nearby nitrogen. The manganese that is mixed with the copper layer is not close to any nitrogen, and thus would be expected to bind strongly to the iodine and make it unavailable as catalytically active iodine on the copper surface. Nevertheless, Applicants have verified that the iodine initially adsorbed on $MnN_x$ or on Cu "floats" to the surface during subsequent CVD of the Cu—Mn alloy, despite the presence of Mn within the alloy. Despite the fact that Mn is known to form stronger bonds to iodine than Cu, and despite the fact that there is no nearby nitrogen to weaken the interaction between iodine and Mn, Applicants surprisingly demonstrate the successful catalytic growth of copper using iodine-containing precursors even in these examples.

Example 20

The Mn precursor is dissolved at a concentration of 0.5 M in an inert solvent, 1-methylnaphthalene, the solution is vaporized by a direct liquid injection system, mixed with ammonia gas, and flowed into a reactor to form a $MnN_x$ layer. The surface of the $MnN_x$ is then exposed to ethyl iodide as in Example 16. The Cu precursor is dissolved at a concentration of 1 M in an inert solvent, 1-methylnaphthalene, the solution is vaporized by a direct liquid injection system, mixed with hydrogen gas, and flowed into the reactor to form a thin Cu layer. The surface of the Cu is then exposed to ethyl iodide as in Example 18. Then separately measured and controlled flows of Cu and Mn precursor solution are simultaneously vaporized in a DLI system, and the resulting mixed vapors, along with the solvent vapor and hydrogen gas, are introduced into the CVD reactor. Results similar to Example 19 are obtained.

Example 21

Example 20 is repeated, except that the Mn and Cu precursors are dissolved together in an inert solvent, 1-methylnaphthalene, and the solution is vaporized in a direct liquid injection system. The mixed precursor vapors, along with the solvent vapor and hydrogen gas, are then introduced into the CVD reactor during the last deposition step, co-deposition of a Cu—Mn alloy. Results similar to Examples 19 and 20 are obtained. The 1-methylnaphthalene used in Examples 20 and 21 may be replaced by other inert solvents with high boiling points, such as diethyl benzene, tetrahydronaphthalene and pristane.

Example 22

Figure 30:
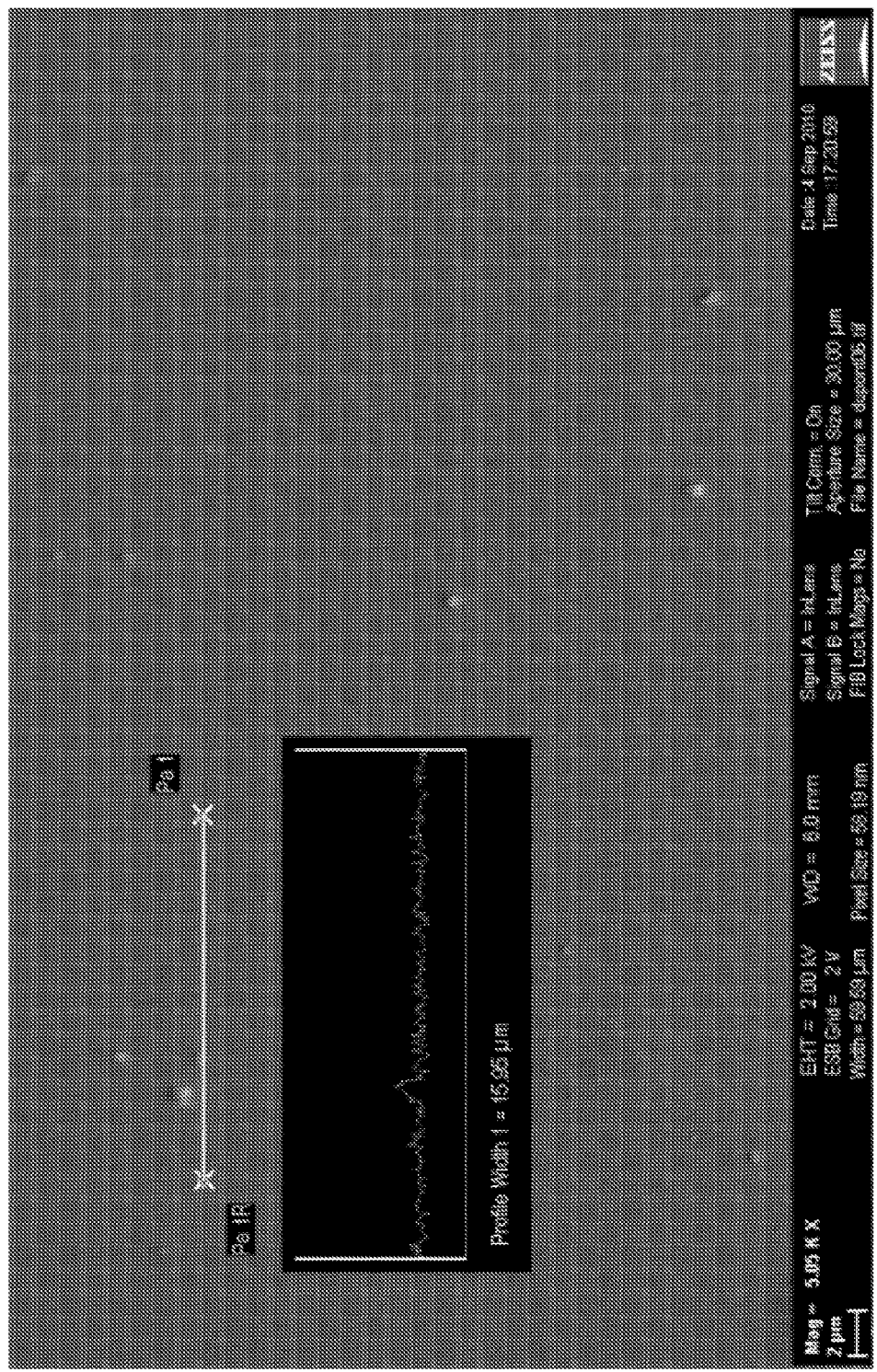
FIG. 30 is an SEM of polyimide plastic coated with $MnN_x$ and Cu in accordance with certain embodiments.
Figure 31:
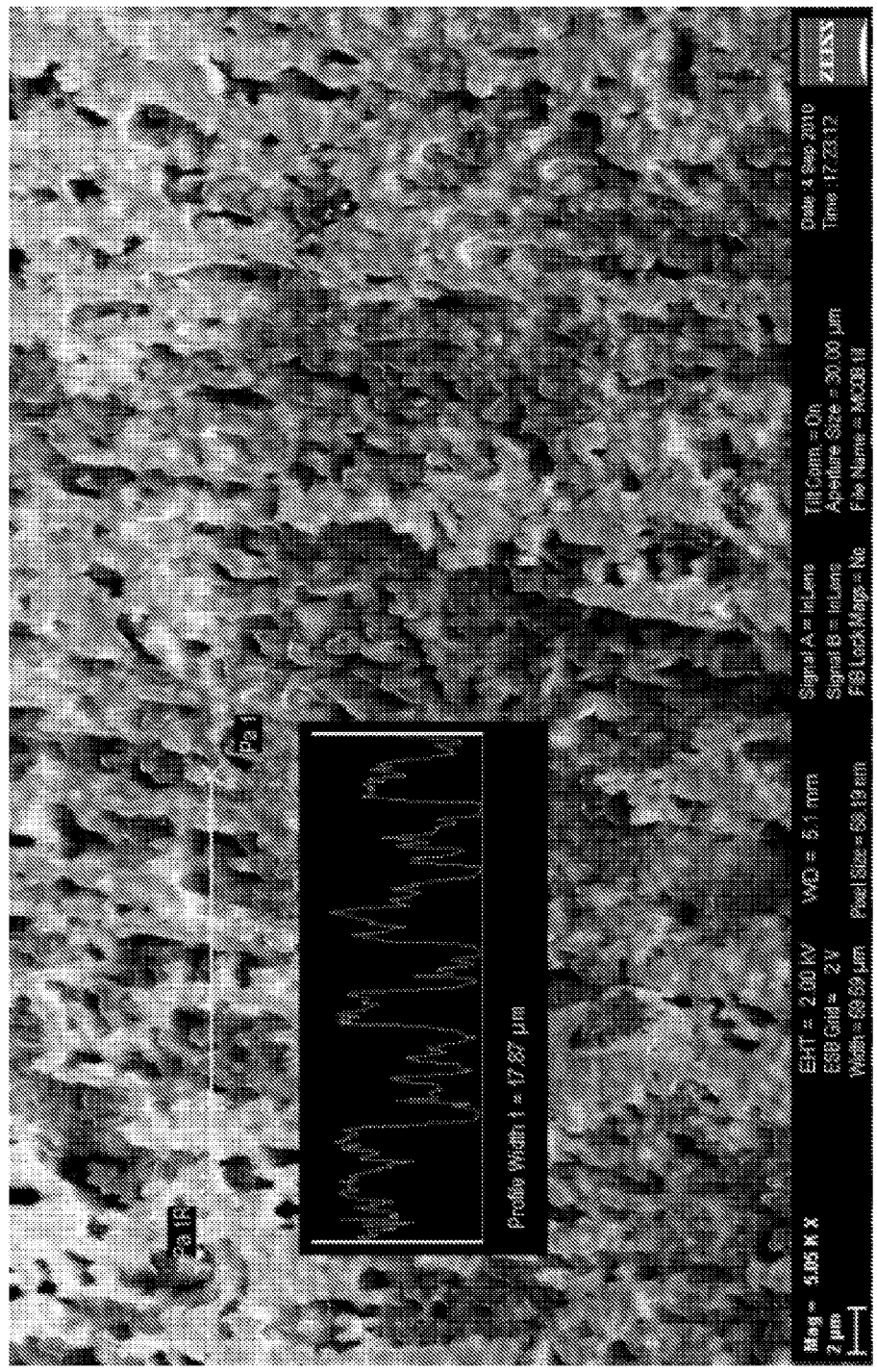
FIG. 31 is an SEM of plastic circuit board material coated with $MnN_x$ and Cu in accordance with certain embodiments.

Example 16 was repeated using substrates of various plastics that are stable up to the deposition temperature of 180° C. Prior to the deposition, the surfaces of the plastics were cleaned and oxidized by exposure to light from a mercury lamp with a quartz envelope in ambient air for 5 minutes. After deposition, the surfaces of the plastics were covered by electrically conductive copper films with sheet resistance around 0.5 ohms per square. The smooth surface of a polyimide plastic sheet remained smooth, as shown in FIG. 30. The rough surface of a fiberglass-reinforced circuit board was covered conformally, as shown in FIG. 31. The copper adhered strongly to the plastics, and could not be removed by a tape test.

Example 23

CVD in accordance with one or more of the previous examples can be used to form a thin layer comprising Mn and Cu with a small amount of I on the surface. The thin layer comprising Mn, Cu, and I can serve as a seed layer for electroplating a thicker layer of Cu. In a substrate with both narrow and wide trenches, the CVD steps may fill the narrow trenches, while conformally coating the wider trenches. Subsequent electroplating can then fill the wider trenches economically.

A small amount of iodine (much less than a monolayer) is attached to the copper surface at the beginning of the electroplating step of Example 23. There is a possibility that this iodine could dissolve in the copper plating bath and contaminate it. Alternatively, the iodine might remain under the plated copper and cause corrosion or reliability problems later. Therefore it could be advantageous to remove the iodine from the copper surface prior to plating. The following two examples present novel methods for removal of the residual iodine from the surface of copper or copper-manganese alloys.

Example 24

A CVD $MnN_x$-CVD Cu—Mn sample was prepared as in Example 19. The sample was then placed into a solution of 30% hydrogen peroxide-70% water for 1 minute at room temperature. It was then rinsed in isopropanol and dried. Examination of the surface by XPS showed that no iodine remained on the surface. Other oxidizing agents, such as sodium hypochlorite or sodium hypobromite, may be substituted for the hydrogen peroxide, in order to remove the iodine from the copper surface.

Example 25

A CVD $MnN_x$-CVD Cu—Mn sample was prepared as in Example 19. The sample was then placed in a reactive ion-etch system. It was first treated by an oxygen plasma with 150 watt microwave power and 50 watt RF power at 10 mTorr pressure for 30 seconds at room temperature. It was then treated by a hydrogen plasma with 150 watt microwave power and 50 watt RF power at 10 mTorr pressure for 3 minutes at room temperature. Examination of the surface by XPS showed that no iodine remained on the surface.

In the case that only narrow trenches are to be filled with copper, it may be desirable to prevent growth of copper on the flat upper surface of the substrates, in order to minimize the amount of copper that may need to be removed subsequently by CMP. This selective process is outlined in Example 26.

Example 26

Example 19 is repeated, except that after the second iodine exposure, the plasma treatment of Example 25 is applied to remove the iodine catalyst from the upper flat surface of the substrate. The plasma process is limited to a time short enough so that iodine is not removed from the sides and bottoms of the narrow trenches. Then the remaining superfill of the trenches is completed by iodine-catalyzed CVD of copper-manganese alloy. Only a small amount of copper-manganese alloy forms on the top surface, along with some bumps over the trenches. This small overburden of copper-manganese alloy is readily removed by a short CMP process.

If the iodine catalyst is removed from the upper part of the sidewalls of the trenches, then the bottom-up growth can proceed further before copper growing from the upper parts of the sidewalls of the trench meet and prevent further growth of copper below the point of closure. Thus trenches and vias with higher aspect ratios can be filled without voids or seams. This selective process for filling narrower and deeper trenches is illustrated in Example 27.

Example 27

Example 26 is repeated, except that the oxygen plasma and the hydrogen plasma are applied for a longer time, so that the iodine is removed from the upper sidewalls of very narrow trenches, as well as from the flat top surfaces between the trenches. Trenches with aspect ratios higher than 10:1 are filled without voids or seams.

If the iodine catalyst is removed from most of the sidewalls of very narrow trenches, and in addition the nucleation rate of copper is suppressed on the upper parts of the sidewalls and the tops of the trenches, then extremely narrow trenches can be filled without voids or seams. One approach to suppressing the nucleation of copper is to react the copper (and manganese, if present) on the upper sidewalls with a reactant vapor, such as an alkanethiol. Once an alkanethiol is chemisorbed on the surface of the copper, applicants have found that further growth of copper by CVD is greatly retarded or even eliminated. Use of iodine removal followed by inactivation of the copper surface on the sidewalls is illustrated by Example 28.

Example 28

Example 27 is repeated using substrates having with very narrow trenches with aspect ratio greater than 20:1. Following the plasma-activated removal of the iodine from most of the trench walls, the surface is exposed briefly to a small amount of vapor of octanethiol. Subsequently, CVD copper-manganese is continued with the benefit of iodine catalyst from the bottom and lower sidewalls of the trenches. The trenches are filled with copper-manganese alloy without any voids or seams.

Those skilled in the art may make various modifications and additions without departing from the spirit and scope of the present contribution to the art.

We claim:

1. A process for forming an integrated circuit interconnect structure, said process comprising:
   a) providing a partially-completed interconnect structure having one or more vias and trenches, said vias and trenches comprising sidewalls defined by one or more electrically insulating materials and electrically conductive copper-containing bottom regions;
   b) depositing a layer comprising a nitride of a metal selected from the group consisting of manganese, chromium and vanadium on the partially-completed interconnect structure;
   c) depositing copper within said one or more vias and trenches.

2. The process of claim 1, further comprising removing nitrogen from said layer comprising metal nitride prior to said depositing copper within said one or more vias and trenches.

3. The process as in claim 2 wherein said removing nitrogen is accomplished by contact of the structure with a hydrogen-containing plasma.

4. The process as in claim 1 wherein said depositing copper comprises electroplating or electroless plating from a liquid solution.

5. The process as in claim 1 wherein said depositing copper comprises deposition from the vapor phase by CVD or ALD.

6. The process as in claim 1, wherein said layer comprising a nitride of a metal comprises manganese nitride.

* * * * *